US012652794B2

(12) United States Patent
Kim et al.

(10) Patent No.: US 12,652,794 B2
(45) Date of Patent: Jun. 9, 2026

(54) SEMICONDUCTOR DEVICE

(71) Applicant: Samsung Electronics Co., Ltd., Suwon-si (KR)

(72) Inventors: Jun Kwan Kim, Suwon-si (KR); Dong Woo Kim, Suwon-si (KR); Mun Jun Kim, Suwon-si (KR); On Yu Bae, Suwon-si (KR); Yong Jin Shin, Suwon-si (KR); Kyoung Min Woo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 372 days.

(21) Appl. No.: 18/527,470

(22) Filed: Dec. 4, 2023

(65) Prior Publication Data

US 2024/0196598 A1     Jun. 13, 2024

(30) Foreign Application Priority Data

Dec. 7, 2022     (KR) ........................ 10-2022-0169512

(51) Int. Cl.
H10B 12/00     (2023.01)
(52) U.S. Cl.
CPC ........... H10B 12/34 (2023.02); H10B 12/033 (2023.02); H10B 12/053 (2023.02); H10B 12/315 (2023.02)
(58) Field of Classification Search
CPC .. H10B 12/033; H10B 12/053; H10B 12/315; H10B 12/34; H10D 64/685; H10D 64/691; H10D 64/693
See application file for complete search history.

(56) References Cited

U.S. PATENT DOCUMENTS

| | | | |
|---|---|---|---|
| 5,872,387 A | 2/1999 | Lyding et al. | |
| 7,867,849 B2 | 1/2011 | Lee et al. | |
| 8,067,313 B2 | 11/2011 | Nakamura | |
| 8,865,573 B2 | 10/2014 | Kwak | |
| 9,917,091 B2 | 3/2018 | Kugimiya et al. | |
| 2002/0031920 A1* | 3/2002 | Lyding .............. | H01L 21/28176 |
| | | | 257/E21.194 |
| 2002/0140043 A1* | 10/2002 | Mitani ................ | H01L 21/3003 |
| | | | 257/411 |
| 2006/0270192 A1* | 11/2006 | Cheng ................ | H10D 30/6758 |
| | | | 438/459 |

(Continued)

*Primary Examiner* — David C Spalla
(74) *Attorney, Agent, or Firm* — Muir Patent Law, PLLC

(57) ABSTRACT

A semiconductor device is provided. The semiconductor device includes a substrate containing deuterium at a first concentration, an active pattern disposed on the substrate and extending in a first horizontal direction, a gate electrode disposed on the active pattern and extending in a second horizontal direction different from the first horizontal direction, a gate insulating layer disposed between the active pattern and the gate electrode, the gate insulating layer containing deuterium at a second concentration, a first interlayer insulating layer disposed on the gate electrode, a second interlayer insulating layer disposed on the first interlayer insulating layer, and a wiring pattern disposed inside the second interlayer insulating layer, the wiring pattern containing deuterium at a third concentration lower than the first concentration, wherein each of the first to third concentrations is a concentration of deuterium atoms contained in the same unit volume.

20 Claims, 25 Drawing Sheets

(56) References Cited

U.S. PATENT DOCUMENTS

| | | |
|---|---|---|
| 2010/0013039 A1 | 1/2010 | Qian et al. |
| 2021/0167211 A1* | 6/2021 | Yamazaki .............. H10D 30/68 |
| 2022/0102514 A1 | 3/2022 | Kim |

* cited by examiner

SEMICONDUCTOR DEVICE

CROSS-REFERENCE TO RELATED APPLICATION

This application claims priority to Korean Patent Application No. 10-2022-0169512 filed on Dec. 7, 2022 in the Korean Intellectual Property Office, and all the benefits accruing therefrom under 35 U.S.C. 119, the contents of which in their entirety are herein incorporated by reference.

BACKGROUND

Technical Field

The present disclosure relates to a semiconductor device.

Description of Related Art

A buried channel array transistor (BCAT) includes a gate electrode buried in a trench and can overcome a short channel effect of a DRAM structure.

As semiconductor devices are increasingly highly integrated, individual circuit patterns are becoming more miniaturized to implement a larger number of semiconductor devices in the same region. That is, a design rule on components of the semiconductor device is decreasing. As a DRAM device is also highly integrated, the number of charges stored in a capacitor is steadily decreasing. Therefore, research is being conducted to increase the number of the charge stored in the capacitor and to reduce leakage.

SUMMARY

Aspects of the present disclosure provide a semiconductor device in which an upper wiring layer is formed and then an annealing process (Heat) that diffuses deuterium from a deuterium-containing layer on a bottom of a substrate is executed such that the deuterium is diffused into each of the substrate, a gate insulating layer and the upper wiring layer such that concentrations of the deuterium respectively contained in the substrate, the gate insulating layer and the upper wiring layer are decreased in this order, thereby, preventing the upper wiring layer from deteriorating and thus reducing GIDL (Gate Induced Drain Leakage).

According to some embodiments of the present disclosure, there is provided a semiconductor device, comprising a substrate containing deuterium at a first concentration, an active pattern disposed on the substrate and extending in a first horizontal direction, a gate electrode disposed on the active pattern and extending in a second horizontal direction different from the first horizontal direction, a gate insulating layer disposed between the active pattern and the gate electrode, the gate insulating layer containing deuterium at a second concentration, a first interlayer insulating layer disposed on the gate electrode, a second interlayer insulating layer disposed on the first interlayer insulating layer, and a wiring pattern disposed inside the second interlayer insulating layer, the wiring pattern containing deuterium at a third concentration lower than the first concentration, wherein each of the first to third concentrations is a concentration of deuterium atoms contained in the same unit volume.

According to some embodiments of the present disclosure, there is provided a semiconductor device, comprising a substrate containing deuterium at a first concentration, an active pattern disposed on the substrate and extending in a first horizontal direction, a gate electrode disposed on the active pattern and extending in a second horizontal direction different from the first horizontal direction, a gate insulating layer disposed between the active pattern and the gate electrode, the gate insulating layer containing deuterium at a second concentration lower than the first concentration, a first interlayer insulating layer disposed on the gate electrode, a second interlayer insulating layer disposed on the first interlayer insulating layer, and a wiring pattern disposed inside the second interlayer insulating layer, the wiring pattern containing deuterium at a third concentration, wherein each of the first to third concentrations is a concentration of deuterium atoms contained in the same unit volume.

According to some embodiments of the present disclosure, there is provided a semiconductor device, comprising a substrate containing deuterium at a first concentration, an active pattern disposed on the substrate and extending in a first horizontal direction, a gate electrode extending in a second horizontal direction different from the first horizontal direction, a vertical level of a top surface of the gate electrode is lower than a vertical level of a top surface of the active pattern, at least a portion of the gate electrode overlaps with the active pattern in the first horizontal direction, a gate insulating layer disposed between the active pattern and the gate electrode, the gate insulating layer containing deuterium at a second concentration lower than the first concentration, a first interlayer insulating layer disposed on the gate electrode, a lower electrode disposed on the first interlayer insulating layer and extending in a vertical direction, an upper electrode surrounding the lower electrode, a capacitor dielectric layer disposed between the lower electrode and the upper electrode, the capacitor dielectric layer containing deuterium at a third concentration lower than the second concentration, a second interlayer insulating layer disposed on the upper electrode, and a wiring pattern disposed inside the second interlayer insulating layer, the wiring pattern containing deuterium at a fourth concentration lower than the third concentration, wherein each of the first to fourth concentrations is a concentration of deuterium atoms contained in the same unit volume.

Purposes according to the present disclosure are not limited to the above-mentioned aspects. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

The specific details of other embodiments are included in the detailed description and drawings.

BRIEF DESCRIPTION OF DRAWINGS

The above and other aspects and features of the present disclosure will become more apparent by describing in detail embodiments thereof with reference to the attached drawings, in which:

FIG. 3 to FIG. 18 are diagrams of intermediate structures corresponding to intermediate steps for illustrating a method for manufacturing a semiconductor device according to some embodiments of the present disclosure;

DETAILED DESCRIPTIONS

Figure 1:
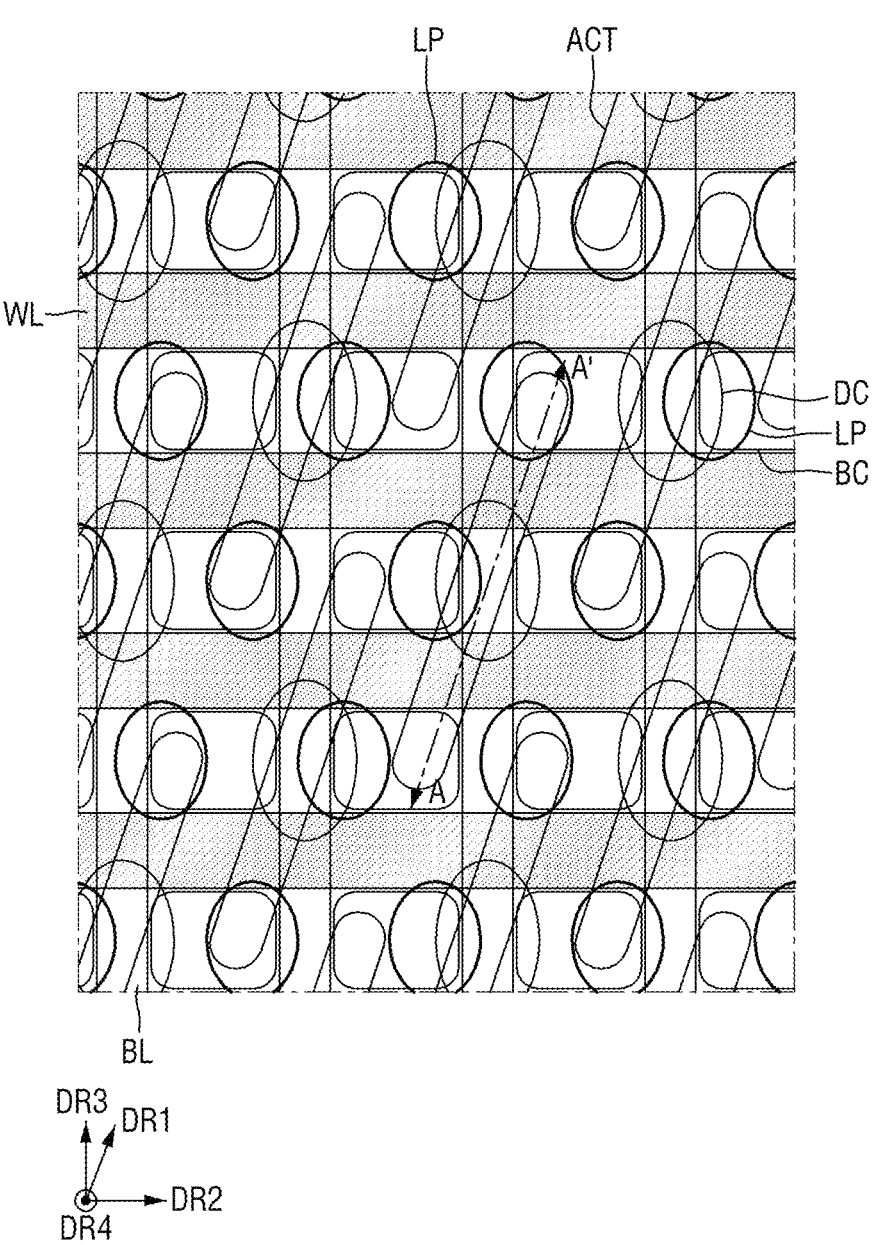
FIG. 1 is a layout diagram for illustrating a semiconductor device according to some embodiments of the present disclosure.

Hereinafter, embodiments of the present disclosure will be described in detail with reference to the accompanying drawings. The same reference numerals are used for the same components in the drawings, and duplicate descriptions thereof are omitted.

Hereinafter, a semiconductor device according to some embodiments of the present disclosure is described with reference to FIGS. 1 and 2.

FIG. 1 is a layout diagram for illustrating a semiconductor device according to some embodiments of the present disclosure. FIG. 2 is a cross-sectional view taken along a line A-A' in FIG. 1.

Referring to FIG. 1, a semiconductor device according to some embodiments of the present disclosure may have a dynamic random access memory (DRAM) structure. For example, a semiconductor device according to some embodiments of the present disclosure may include a plurality of cell active regions ACT, a plurality of word-lines WL, a plurality of bit-lines BL, a direct contact DC, a buried contact BC, and a landing pad LP.

Figure 2:
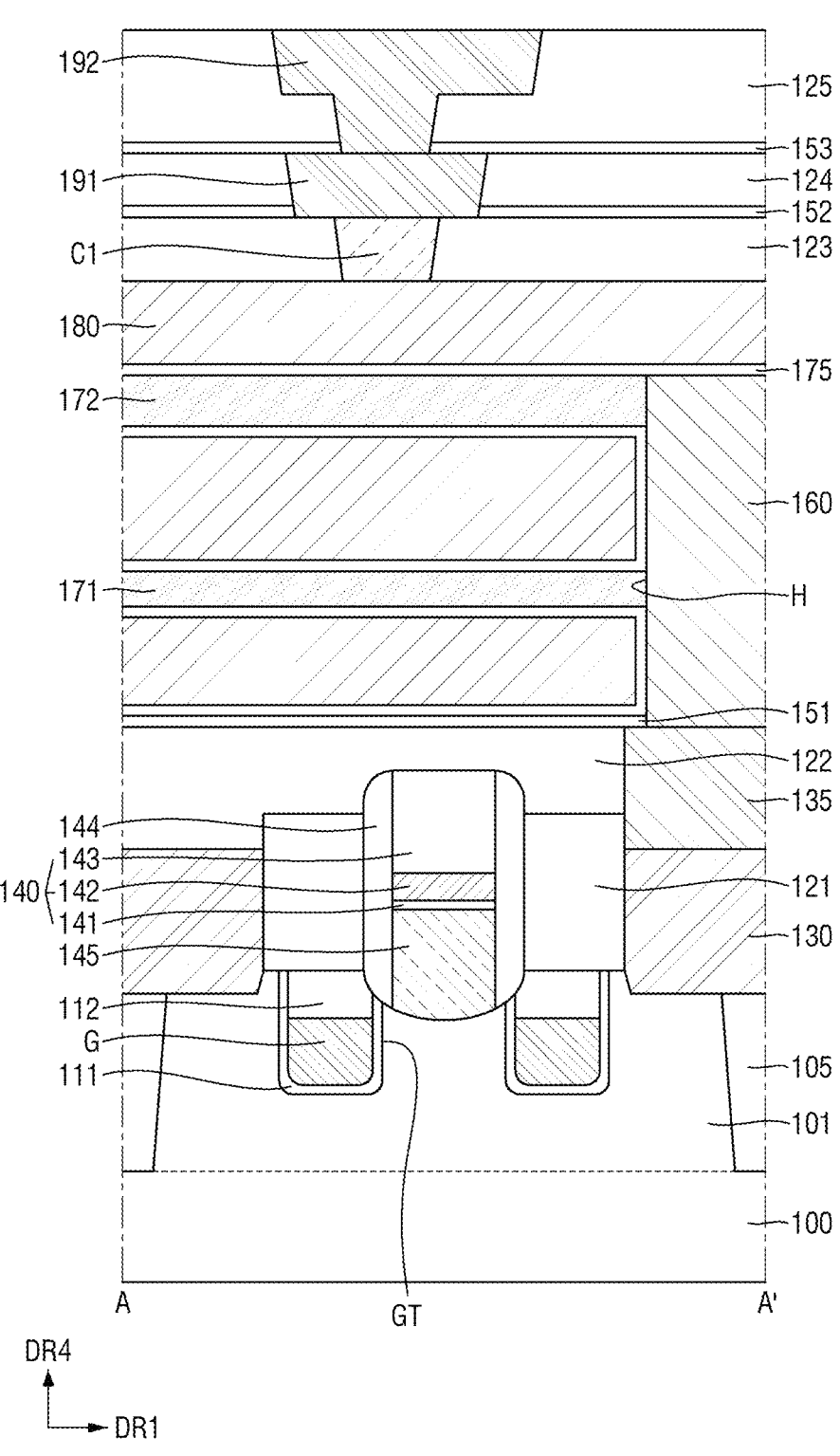
FIG. 2 is a cross-sectional view taken along a line A-A' in FIG. 1.

In FIG. 1, each of a first horizontal direction DR1, a second horizontal direction DR2, and a third horizontal direction DR3 may be a direction parallel to a top surface of a substrate (100 in FIG. 2). The third horizontal direction DR3 may be a direction perpendicular to the second horizontal direction DR2. The first horizontal direction DR1 may be a direction having an acute angle with respect to the second horizontal direction DR2. A vertical direction DR4 may be a direction perpendicular to a plane defined by (e.g., parallel to) the first to third horizontal directions DR1, DR2, and DR3.

The plurality of cell active regions ACT may be defined by a cell element isolation layer (105 in FIG. 2) formed in the substrate (100 in FIG. 2). As the design rule of the semiconductor device is reduced, the active region ACT may extend in a form of an oblique or diagonal linear bar as shown in FIG. 1. For example, the cell active regions ACT may extend (e.g., lengthwise) in the first horizontal direction DR1. Each cell active region ACT may be an active pattern (101 in FIG. 2) shown in FIG. 2.

Each of the plurality of word-lines WL may intersect cell active regions ACT and extend (e.g., lengthwise) in the second horizontal direction DR2. For example, each of the plurality of word-lines WL may be buried in an active pattern (101 in FIG. 2). The plurality of word-lines WL may be spaced apart from each other in the third horizontal direction DR3. The plurality of word-lines WL may extend in a parallel to each other. For example, the plurality of word-lines WL may be arranged so as to be spaced from each other by the same spacing. A width of each of the plurality of word-lines WL or a spacing between adjacent ones of the plurality of word-lines WL may be determined based on the design rule. Each of the plurality of word-lines WL may be a gate electrode (G in FIG. 2) shown in FIG. 2.

Each of the plurality of bit-lines BL may intersect a plurality of cell active regions ACT and each of the plurality of word-lines WL, and may extend (e.g., lengthwise) in the third horizontal direction DR3. The plurality of bit-lines BL may be spaced apart from each other in the second horizontal direction DR2. The plurality of bit-lines BL may extend in a parallel to each other. For example, the plurality of bit-lines BL may be arranged so as to be spaced from each other by the same spacing. A width of each of the plurality of bit-lines BL or a spacing between adjacent ones of the plurality of bit-lines BL may be determined based on the design rule. Each of the plurality of bit-lines BL may be a bit-line structure (140 in FIG. 2) shown in FIG. 2.

The direct contact DC may be a contact that electrically connects the cell active region ACT to the bit-line BL. The direct contact DC may be a bit-line contact 145 shown in FIG. 2. The buried contact BC may be a contact that connects the cell active region ACT to a lower electrode (160 in FIG. 2) of a capacitor. The buried contact BC may be a storage contact (130 in FIG. 2) shown in FIG. 2. In a layout structure, a contact region between the buried contact BC and the active region ACT may be small. Accordingly, the conductive landing pad LP may be introduced to increase the contact region between the active region ACT and the buried contact BC, and to increase a contact region between the buried contact BC and the lower electrode (160 in FIG. 2) of the capacitor.

As used herein, components described as being "electrically connected" are configured such that an electrical signal can be transferred from one component to the other (although such electrical signal may be attenuated in strength as it transferred and may be selectively transferred).

The landing pad LP may be disposed between the cell active region ACT and the buried contact BC. Further, the landing pad LP may be disposed between the buried contact BC and the lower electrode (160 in FIG. 2) of the capacitor. The contact region may be increased via the introduction of the landing pad LP, such that a contact resistance between the cell active region ACT and the lower electrode (160 in FIG. 2) of the capacitor may be reduced.

The buried contacts BC may be symmetrically arranged with each other around the direct contact DC. The direct contacts DC may be arranged in a straight line along each of the second horizontal direction DR2 and the third horizontal direction DR3. The buried contact BC may be arranged in a straight line along each of the second horizontal direction DR2 and the third horizontal direction DR3. The landing pads LP may be arranged in a zigzag manner and in the third horizontal direction DR3 in which the bit-line BL extends.

Referring to FIG. 1 and FIG. 2, the semiconductor device according to some embodiments of the present disclosure includes the substrate 100, an active pattern 101, the element isolation layer 105, a gate insulating layer 111, the gate electrode G, a gate capping pattern 112, first to fifth interlayer insulating layers 121 to 125, the storage contact 130, a storage pad 135, the bit-line structure 140, a bit-line spacer 144, the bit-line contact 145, first to third etch stop layers 151, 152, and 153, the lower electrode 160, first and second supporter patterns 171 and 172, a capacitor dielectric layer 175, an upper electrode 180, a first contact C1, and first and second wiring patterns 191 and 192.

The substrate 100 may be a silicon substrate or a silicon-on-insulator (SOI) substrate. Alternatively, the substrate 100 may include silicon germanium, silicon germanium on insulator (SGOI), indium antimonide, a lead telluride compound, indium arsenide, indium phosphide, gallium arsenide, or gallium antimonide. However, the present disclosure is not limited thereto. For example, the substrate 100 may contain deuterium at a first concentration. In this regard, the first concentration may be a concentration (e.g., quantity/mass/number) of deuterium atoms contained in a unit volume.

The active pattern 101 may correspond to the cell active region ACT shown in FIG. 1. The active pattern 101 may protrude from the substrate 100 in the vertical direction DR4. The active pattern 101 may extend (e.g., lengthwise) in the first horizontal direction DR1. The active pattern 101 may be a portion of the substrate 100, or may include an epitaxial layer grown from the substrate 100.

The element isolation layer 105 may surround a sidewall of the active pattern 101 while being disposed on the substrate 100. For example, the active pattern 101 may be defined by the element isolation layer 105. For example, a top surface of the element isolation layer 105 may be coplanar with a top surface of the active pattern 101. The element isolation layer 105 may include, for example, at least one of a silicon oxide film, a silicon nitride film, and/or a silicon oxynitride film. However, the present disclosure is not limited thereto.

A gate trench GT may extend (e.g., lengthwise) in the second horizontal direction DR2 and may be defined inside each of the active pattern 101 and the element isolation layer 105. For example, a sidewall and a bottom surface of the gate trench GT may be defined by each of the active pattern 101 and the element isolation layer 105.

The gate insulating layer 111 may be disposed along and on the sidewall and the bottom surface of the gate trench GT. For example, the gate insulating layer 111 may be conformally formed, e.g., on the bottom surface and the sidewalls of the trench. For example, the gate insulating layer 111 may contain deuterium at a second concentration. The second concentration of the deuterium contained in the gate insulating layer 111 may be lower than the first concentration of the deuterium contained in the substrate 100. In this regard, the second concentration may be a concentration (e.g., quantity/mass/number) of deuterium atoms contained in a unit volume. The unit volume for the second concentration may be the same volume as the unit volume for the first concentration.

The gate insulating layer 111 may include, for example, at least one of silicon oxide, silicon nitride, silicon oxynitride, and/or a high dielectric constant (high-k) material having a higher dielectric constant than that of silicon oxide. The high dielectric constant (high-k) material may include, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and/or a combination thereof. However, the present disclosure is not limited thereto.

The gate electrode G may correspond to the word-line WL shown in FIG. 1. The gate electrode G may be disposed on the gate insulating layer 111 and inside the gate trench GT. For example, the gate insulating layer 111 may be disposed between the active pattern 101 and the gate electrode G. The gate electrode G may fill a portion of the gate trench GT. The gate electrode G may extend (e.g., lengthwise) in the second horizontal direction DR2. For example, a top surface of the gate electrode G may be positioned at a vertical level lower than that of a top surface of the active pattern 101. For example, at least a portion of the gate electrode G may overlap the active pattern 101 in the first horizontal direction DR1.

The gate electrode G may include at least one of a metal, a metal alloy, a conductive metal nitride, a conductive metal carbonitride, a conductive metal carbide, a metal silicide, a doped semiconductor material, a conductive metal oxynitride, and/or a conductive metal oxide. The gate electrode G may include, for example, TiN, TaC, TaN, TiSiN, TaSiN, TaTiN, TiAlN, TaAlN, WN, Ru, TiAl, TiAlC—N, TiAlC, TiC, TaCN, W, Al, Cu, Co, Ti, Ta, Ni, Pt, Ni—Pt, Nb, NbN, NbC, Mo, MoN, MoC, WC, Rh, Pd, Ir, Ag, Au, Zn, V, RuTiN, TiSi, TaSi, NiSi, CoSi, IrOx, $RuO_x$, or a combination thereof. However, the present disclosure is not limited thereto.

The gate capping pattern 112 may be disposed on the gate electrode G and the gate insulating layer 111 and inside the gate trench GT. The gate capping pattern 112 may fill the remaining portion of the gate trench GT. For example, the gate capping pattern 112 may extend (e.g., lengthwise) in the second horizontal direction DR2. For example, a top surface of the gate capping pattern 112 may be coplanar with the top surface of the active pattern 101. The gate capping pattern 112 may include, for example, silicon nitride (SiN), silicon oxynitride (SiON), silicon oxide ($SiO_2$), silicon carbonitride (SiCN), silicon oxycarbonitride (SiOCN), or a combination thereof.

Although not shown in FIG. 2, an impurity doped region may be formed on at least one side of the gate electrode G in the first horizontal direction DR1. The impurity doped region may be a source/drain region of a transistor.

The bit-line structure 140 may extend (e.g., lengthwise) in the third horizontal direction DR3 while being disposed on the active pattern 101 and the element isolation layer 105. The bit-line structure 140 may intersect each of the active pattern 101 and the gate electrode G. For example, the bit-line structure 140 may include a first conductive layer 141, a second conductive layer 142, and a bit-line capping pattern 143. The first conductive layer 141 and the second conductive layer 142 may correspond to the bit-line BL as shown in FIG. 1. FIG. 2 illustrates that the bit-line (BL in FIG. 1) is formed as a stack of two films including the first conductive layer 141 and the second conductive layer 142. However, the present disclosure is not limited thereto. For example, in certain embodiments, the bit-line (BL in FIG. 1) may be formed as a stack of at least three films.

The first conductive layer 141 and the second conductive layer 142 may be sequentially stacked on the active pattern 101 and the element isolation layer 105. Each of the first conductive layer 141 and the second conductive layer 142 may extend (e.g., lengthwise) in the third horizontal direction DR3 while being disposed on the active pattern 101 and the element isolation layer 105. The first conductive layer 141 may include, for example, at least one of a conductive silicide compound and/or a conductive metal nitride. The second conductive layer 142 may include, for example, at least one of a metal and/or a metal alloy.

The bit-line capping pattern 143 may be disposed on the second conductive layer 142. The bit-line capping pattern 143 may extend (e.g., lengthwise) in the third horizontal direction DR3 while being disposed on the second conductive layer 142. The bit-line capping pattern 143 may include, for example, at least one of silicon nitride, silicon oxynitride, silicon carbonitride, and/or silicon oxycarbonitride. Although the bit-line capping pattern 143 is illustrated as being embodied as a single film in FIG. 2, the present disclosure is not limited thereto.

The bit-line contact 145 may correspond to the direct contact DC shown in FIG. 1. The bit-line contact 145 may be disposed between the active pattern 101 and the first conductive layer 141. The bit-line contact 145 may contact the first conductive layer 141. The bit-line contact 145 may extend (e.g., lengthwise) in the vertical direction DR4. The bit-line contact 145 may extend (e.g., lengthwise) into the active pattern 101. For example, the bit-line contact 145 may be disposed in a region where the active pattern 101 and the first conductive layer 141 intersect each other. The bit-line contact 145 may electrically connect the active pattern 101 and the first conductive layer 141 to each other. The bit-line contact 145 may include, for example, at least one of a semiconductor material doped with impurities, a conductive silicide compound, a conductive metal nitride, and/or a metal.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

Bit-line spacers 144 may be disposed on both opposing sidewalls of each of the bit-line contact 145, the first conductive layer 141, the second conductive layer 142, and the bit-line capping pattern 143. The bit-line spacers 144 may contact both opposing sidewalls of each of the bit-line contact 145, the first conductive layer 141, the second conductive layer 142, and the bit-line capping pattern 143. The bit-line spacers 144 may extend (e.g., lengthwise) in the third horizontal direction DR3. For example, the bit-line spacers 144 may overlap gate electrodes G in the vertical direction DR4. For example, at least a portion of the bit-line spacer 144 may contact each of the gate insulating layer 111 and the gate capping pattern 112. However, the present disclosure is not limited thereto.

FIG. 2 illustrates that the bit-line spacer 144 is formed as a single film. This is intended for convenience of illustration, and the present disclosure is not limited thereto. For example, the bit-line spacer 144 may be formed as a stack of multiple films. The bit-line spacer 144 may include, for example, a silicon oxide layer, a silicon nitride layer, a silicon oxynitride layer (SiON), a silicon oxycarbonitride layer (SiOCN), or a combination thereof. However, the present disclosure is not limited thereto.

The storage contact 130 may correspond to the buried contact BC shown in FIG. 1. The storage contact 130 may be disposed between adjacent bit-lines (BC in FIG. 1). Further, the storage contact 130 may be disposed between adjacent word-lines (WL in FIG. 1). The storage contact 130 may be disposed on each of the active pattern 101 and the element isolation layer 105. For example, the storage contact 130 may overlap the active pattern 101 in the vertical direction DR4. The storage contact 130 may be electrically connected to the active pattern 101.

For example, a bottom surface of the storage contact 130 may be positioned at a vertical level lower than that of the top surface of the active pattern 101. However, the present disclosure is not limited thereto. The storage contact 130 may include, for example, at least one of a semiconductor material doped with impurities, a conductive silicide compound, a conductive metal nitride, and/or a metal.

The first interlayer insulating layer 121 may surround a sidewall of the storage contact 130 while being disposed on the active pattern 101 and the element isolation layer 105. The first interlayer insulating layer 121 may cover a top surface of the gate capping pattern 112. The first interlayer insulating layer 121 may surround a sidewall of the bit-line spacer 144. The first interlayer insulating layer 121 may include, for example, silicon oxide, silicon nitride, silicon oxynitride, a low dielectric constant (low-k) material, or a combination thereof.

The storage pad 135 may correspond to the landing pad LP shown in FIG. 1. The storage pad 135 may be disposed on the storage contact 130. The storage pad 135 may be electrically connected to the storage contact 130. For example, at least a portion of the storage pad 135 may overlap the bit-line (BL in FIG. 1) in the vertical direction DR4. The storage pad 135 may include, for example, at least one of a semiconductor material doped with impurities, a conductive silicide compound, a conductive metal nitride, a conductive metal carbide, a metal, and/or a metal alloy.

The second interlayer insulating layer 122 may be disposed on the first interlayer insulating layer 121. The second interlayer insulating layer 122 may cover the bit-line capping pattern 143, the bit-line spacer 144, and the storage contact 130. The second interlayer insulating layer 122 may surround a sidewall of the storage pad 135. For example, a top surface of the second interlayer insulating layer 122 may be coplanar with a top surface of the storage pad 135. The second interlayer insulating layer 122 may include, for example, silicon oxide, silicon nitride, silicon oxynitride, a low dielectric constant (low-k) material, or a combination thereof.

The first etch stop layer 151 may be disposed on a top surface of the second interlayer insulating layer 122. For example, the first etch stop layer 151 may be disposed on a portion of the top surface of the storage pad 135. The first etch stop layer 151 may include, for example, at least one of a silicon nitride film, a silicon carbonitride film, a silicon boron nitride (SiBN) film, a silicon oxynitride film, and/or a silicon oxycarbide film.

The first supporter pattern 171 may be disposed on the first etch stop layer 151. The first supporter pattern 171 may be spaced apart from the first etch stop layer 151 in the vertical direction DR4. The second supporter pattern 172 may be disposed on the first supporter pattern 171. The second supporter pattern 172 may be spaced apart from the first supporter pattern 171 in the vertical direction DR4. For example, a thickness in the vertical direction DR4 of the second supporter pattern 172 may be greater than a thickness in the vertical direction DR4 of the first supporter pattern 171.

Each of the first supporter pattern 171 and the second supporter pattern 172 may include, for example, at least one of silicon oxynitride (SiON), silicon nitride (SiN), silicon carbon nitride (SiCN), and/or tantalum oxide (TaO). For example, the first supporter pattern 171 and the second supporter pattern 172 may include the same material. However, the present disclosure is not limited thereto. For example, in certain embodiments, the first supporter pattern 171 and the second supporter pattern 172 may include different materials from each other.

A lower electrode hole H may be defined on the storage pad 135 and may extend through the second supporter pattern 172, the first supporter pattern 171, and the first etch stop layer 151 in the vertical direction DR4. The top surface of the storage pad 135 may be exposed through the lower electrode hole H. For example, a plurality of lower electrode holes H may be arranged to be spaced apart from each other in a plane defined by (e.g., parallel to) the first to third horizontal directions DR1, DR2, and DR3.

The lower electrode 160 may be disposed inside the lower electrode hole H. For example, the lower electrode 160 may fill an entirety of an inside of the lower electrode hole H. For example, the lower electrode 160 may have a pillar shape. However, the present disclosure is not limited thereto. In some embodiments, the lower electrode 160 may have a cylindrical shape.

For example, a sidewall of the lower electrode 160 may contact each of the first supporter pattern 171 and the second supporter pattern 172. For example, a top surface of the lower electrode 160 may be coplanar with a top surface of the second supporter pattern 172. The lower electrode 160 may include, for example, at least one of a doped semiconductor material, a conductive metal nitride (e.g., titanium nitride, tantalum nitride, niobium nitride, or tungsten nitride, etc.), a metal (e.g., ruthenium, iridium, titanium, or tantalum, etc.), and/or conductive metal oxides (e.g., iridium oxide or niobium oxide). However, the present disclosure is not limited thereto.

The capacitor dielectric layer 175 may be disposed along and on a surface of each of the first etch stop layer 151, the first supporter pattern 171, the second supporter pattern 172, and the lower electrode 160. For example, the capacitor dielectric layer 175 may be conformally formed, e.g., on the lower electrode 160 and the second supporter pattern 172. For example, the capacitor dielectric layer 175 may contain deuterium at a third concentration. The third concentration of deuterium contained in the capacitor dielectric layer 175 may be lower than the first concentration of the deuterium contained in the substrate 100. For example, the third concentration of deuterium in contained in the capacitor dielectric layer 175 may be lower than the second concentration of deuterium in contained in the gate insulating layer 111. In this regard, the third concentration may be a concentration (e.g., quantity/mass/number) of deuterium atoms contained in a unit volume. The unit volume for the third concentration may be the same volume as the unit volume for each of the first concentration and the second concentration.

The capacitor dielectric layer 175 may include, for example, at least one of silicon oxide ($SiO_2$), silicon nitride (SiN), silicon oxynitride (SiON), and/or a high dielectric constant (high-k) material. The high dielectric constant (high-k) material may include, for example, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof. However, the present disclosure is not limited thereto.

The upper electrode 180 may surround each of the lower electrode 160, the first supporter pattern 171, and the second supporter pattern 172 while being disposed on the capacitor dielectric layer 175. For example, the capacitor dielectric layer 175 may be disposed between the first etch stop layer 151 and the upper electrode 180, between the lower electrode 160 and the upper electrode 180, between the first supporter pattern 171 and the upper electrode 180, between the second supporter pattern 172 and the upper electrode 180.

The upper electrode 180 may include, for example, at least one of a doped semiconductor material, a conductive metal nitride (e.g., titanium nitride, tantalum nitride, niobium nitride, or tungsten nitride, etc.), a metal (e.g., ruthenium, iridium, titanium, or tantalum, etc.), and/or a conductive metal oxide (e.g., iridium oxide or niobium oxide, etc.). However, the present disclosure is not limited thereto.

The third interlayer insulating layer 123 may cover the upper electrode 180. The third interlayer insulating layer 123 may include, for example, at least one of silicon oxide ($SiO_2$), silicon nitride (SiN), silicon oxynitride (SiON), tetraethyl orthosilicate (TEOS), and/or a low dielectric constant (low-k) material.

The first contact C1 may extend (e.g., lengthwise) through the third interlayer insulating layer 123 in the vertical direction DR4 and thus be electrically connected to and/or contact the upper electrode 180. For example, a top surface of the first contact C1 may be coplanar with a top surface of the third interlayer insulating layer 123. However, the present disclosure is not limited thereto. The first contact C1 may include a conductive material. FIG. 2 illustrates that the first contact C1 is formed as a single film. This is intended for convenience of illustration, and the present disclosure is not limited thereto. For example, the first contact C1 may be formed as a stack of multiple films. For example, the first contact C1 may be formed of a plurality layers of films in certain embodiments.

The second etch stop layer 152 may be disposed on the third interlayer insulating layer 123. For example, the second etch stop layer 152 may be conformally formed, e.g., on the third interlayer insulating layer 123. The second etch stop layer 152 may include, for example, at least one of silicon oxide, silicon nitride, silicon oxynitride, aluminum oxide, aluminum nitride, aluminum oxynitride, and/or a low dielectric constant (low-k) material. The fourth interlayer insulating layer 124 may be disposed on the second etch stop layer 152. The fourth interlayer insulating layer 124 may include, for example, at least one of silicon oxide ($SiO_2$), silicon nitride (SiN), silicon oxynitride (SiON), tetraethyl orthosilicate (TEOS), and/or a low dielectric constant (low-k) material.

The first wiring pattern 191 may be disposed inside each of the second etch stop layer 152 and the fourth interlayer insulating layer 124. The first wiring pattern 191 may be electrically connected to and/or contact the first contact C1. For example, at least a portion of a bottom surface of the first wiring pattern 191 may contact the third interlayer insulating layer 123. For example, a top surface of the first wiring pattern 191 may be coplanar with a top surface of the fourth interlayer insulating layer 124. However, the present disclosure is not limited thereto. For example, the first wiring pattern 191 may contain deuterium at a fourth concentration. The fourth concentration of deuterium contained in the first wiring pattern 191 may be lower than the first concentration of deuterium contained in the substrate 100. Further, the fourth concentration of deuterium contained in the first wiring pattern 191 may be lower than the second concentration of deuterium contained in the gate insulating layer 111. Further, the fourth concentration of deuterium contained in the first wiring pattern 191 may be lower than the third concentration of deuterium contained in the capacitor dielectric layer 175. In this regard, the fourth concentration may be a concentration (e.g., quantity/mass/number) of deuterium atoms contained in a unit volume. The unit volume for the fourth concentration may be the same volume as the unit volume for each of the first concentration, the second concentration, and the third concentration.

The first wiring pattern 191 may include a conductive material. FIG. 2 illustrates that the first wiring pattern 191 is formed as a single film. This is intended for convenience of illustration, and the present disclosure is not limited thereto. For example, the first wiring pattern 191 may be formed as a stack of multiple films.

The third etch stop layer 153 may be disposed on the fifth interlayer insulating layer 125. For example, the third etch stop layer 153 may be conformally formed, e.g., on the fifth interlayer insulating layer 125. The third etch stop layer 153 may include, for example, at least one of silicon oxide, silicon nitride, silicon oxynitride, aluminum oxide, aluminum nitride, aluminum oxynitride, and/or a low dielectric constant (low-k) material. The fifth interlayer insulating layer 125 may be disposed on the third etch stop layer 153. The fifth interlayer insulating layer 125 may include, for example, at least one of silicon oxide ($SiO_2$), silicon nitride (SiN), silicon oxynitride (SiON), tetraethyl orthosilicate (TEOS), and/or a low dielectric constant (low-k) material.

The second wiring pattern 192 may be disposed inside each of the third etch stop layer 153 and the fifth interlayer insulating layer 125. The second wiring pattern 192 may be electrically connected to and/or contact the first wiring pattern 191. For example, a top surface of the second wiring pattern 192 may be coplanar with a top surface of the fifth interlayer insulating layer 125, and a bottom surface of the second wiring layer 192 may be coplanar with a bottom surface of the third etch stop layer 153. However, the present disclosure is not limited thereto. The second wiring pattern 192 may include a conductive material. FIG. 2 illustrates that the second wiring pattern 192 is formed as a single film. However, this is intended for convenience of illustration, and the present disclosure is not limited thereto. For example, the second wiring pattern 192 may be formed as a stack of multiple films.

Hereinafter, a method for manufacturing a semiconductor device according to some embodiments of the present disclosure is described with reference to FIG. 3 to FIG. 18.

FIG. 3 to FIG. 18 are diagrams of intermediate structures corresponding to intermediate steps for illustrating a method for manufacturing a semiconductor device according to some embodiments of the present disclosure.

Figure 3:
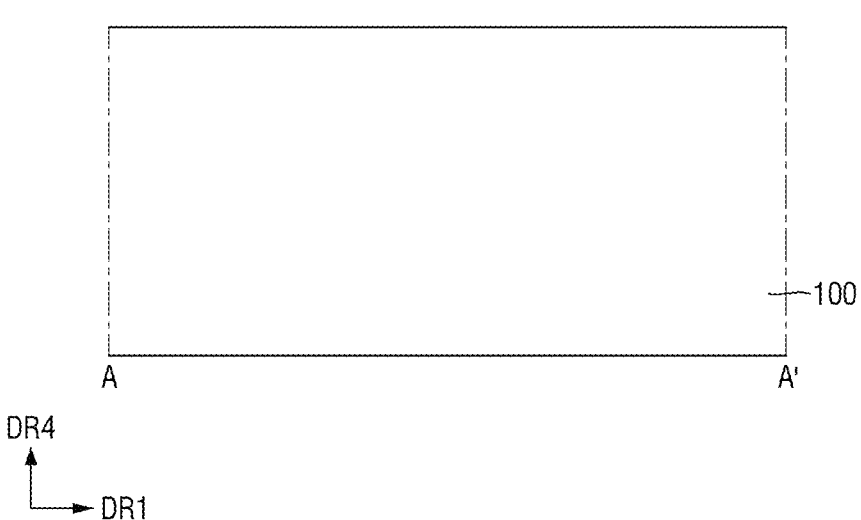
Figure 4:
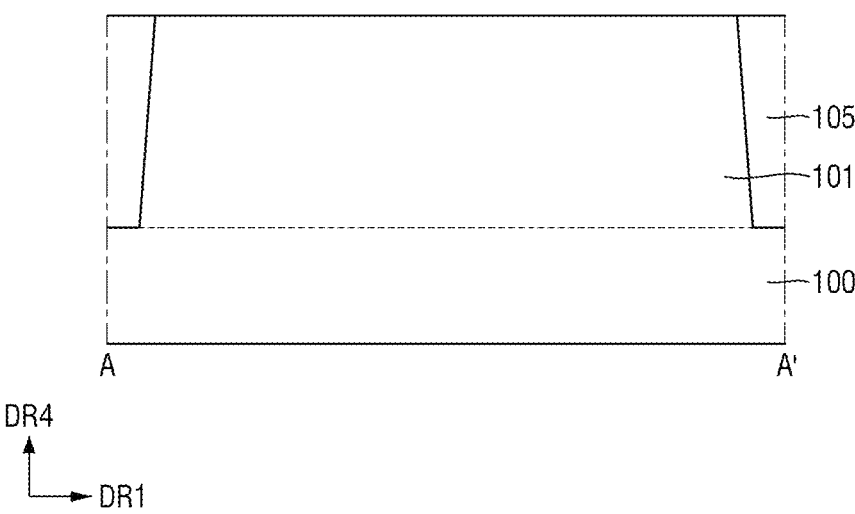

Referring to FIGS. 3 and 4, a portion of the substrate 100 may be etched to form the active pattern 101 extending (e.g., lengthwise) in the first horizontal direction DR1. Subsequently, the element isolation layer 105 surrounding a sidewall of the active pattern 101 may be formed on the substrate 100. For example, the active pattern 101 may be defined by the element isolation layer 105. For example, the top surface of the element isolation layer 105 may be coplanar with the top surface of the active pattern 101. However, the present disclosure is not limited thereto.

Figure 5:
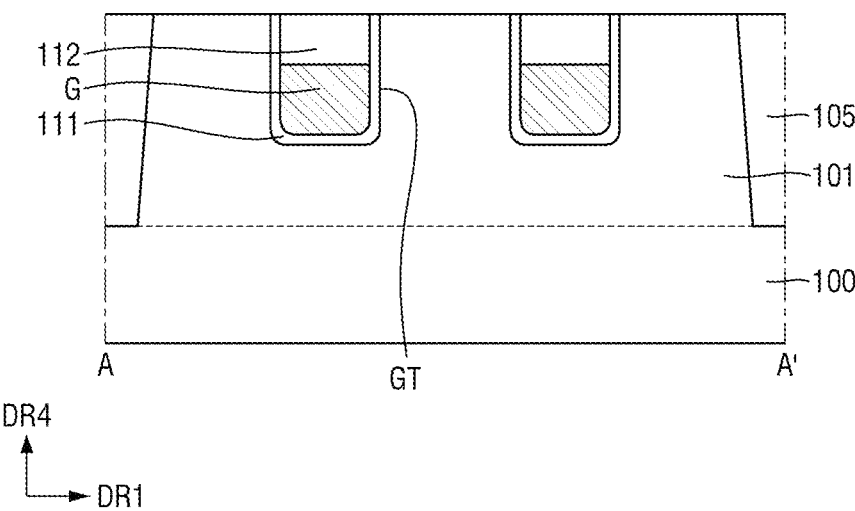

Referring to FIG. 5, the gate trench GT extending in the second horizontal direction (DR2 in FIG. 1) may be formed inside the active pattern 101. Although not shown, the gate trench GT may also be formed inside the element isolation layer 105. Subsequently, the gate insulating layer 111 may be formed along and on the sidewall and the bottom surface of the gate trench GT. For example, the gate insulating layer 111 may be conformally formed, e.g., on the bottom surface and sidewalls of the gate trench GT. Subsequently, the gate electrode G and the gate capping pattern 112 may be sequentially formed on the gate insulating layer 111 while being received inside the gate trench GT. For example, the top surface of the gate capping pattern 112 may be coplanar with the top surface of the active pattern 101.

Figure 6:
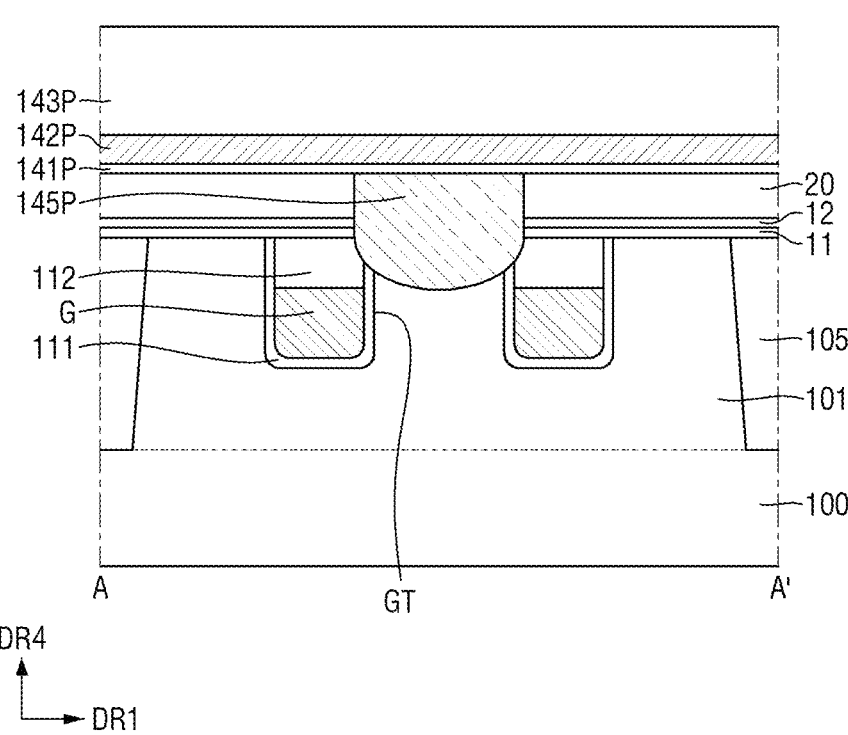

Referring to FIG. 6, a first cell insulating layer 11, a second cell insulating layer 12 and a first pre-conductive layer 20 may be formed sequentially on the active pattern 101, the element isolation layer 105, and the gate capping pattern 112. For example, each of the first cell insulating layer 11, the second cell insulating layer 12, and the first pre-conductive layer 20 may be conformally formed, e.g., on the active pattern 101, the element isolation layer 105, and the gate capping pattern 112.

For example, the first cell insulating layer 11 may include a silicon oxide film. For example, the second cell insulating layer 12 may include a silicon nitride film. For example, the first pre-conductive layer 20 may include a doped semiconductor material. For example, the first pre-conductive layer 20 may include polysilicon. In some embodiments, the first pre-conductive layer 20 may include, for example, at least one of silicon oxide, silicon nitride, silicon oxynitride, and/or a high dielectric constant (high-k) material having a higher dielectric constant than that of silicon oxide.

Subsequently, a pre-bit-line contact 145p may be formed so as to extend through the first cell insulating layer 11, the second cell insulating layer 12, and the first pre-conductive layer 20 in the vertical direction DR4 and then into the active pattern 101. For example, a top surface of the pre-bit-line contact 145p may be coplanar with a top surface of the first pre-conductive layer 20. The pre-bit-line contact 145p may include, for example, at least one of a semiconductor material doped with impurities, a conductive silicide compound, a conductive metal nitride, and/or a metal.

Then, a second pre-conductive layer 141p, a third pre-conductive layer 142p, and a pre-bit-line capping layer 143p may be sequentially formed on a top surface of the first pre-conductive layer 20 and a top surface of the pre-bit-line contact 145p. For example, each of the second pre-conductive layer 141p, the third pre-conductive layer 142p, and the pre-bit-line capping layer 143p may be conformally formed.

For example, the second pre-conductive layer 141p may include at least one of a conductive silicide compound and/or a conductive metal nitride. For example, the third pre-conductive layer 142p may include at least one of a metal and/or a metal alloy. For example, the pre-bit-line capping layer 143p may include at least one of a silicon nitride film, silicon oxynitride, silicon carbonitride, and/or silicon oxycarbonitride.

Figure 7:
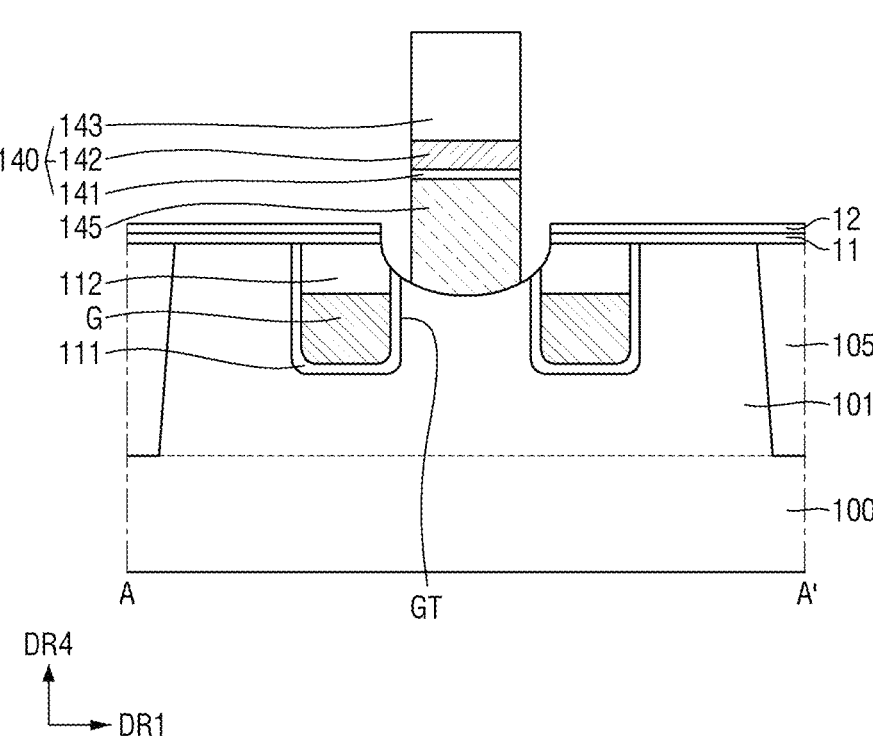

Referring to FIG. 7, a portion of each of the pre-bit-line contact (145p in FIG. 6), the second pre-conductive layer (141p in FIG. 6), the third pre-conductive layer (142p in FIG. 6) and the pre-bit-line capping layer (143p in FIG. 6) may be etched. A remaining portion of the pre-bit-line contact (145p in FIG. 6), each of a remaining portion of the second pre-conductive layer (141p in FIG. 6), a remaining portion of the third pre-conductive layer (142p in FIG. 6), and a remaining portion of the pre-bit-line capping layer (143p in FIG. 6) may overlap with the active pattern 101 in the vertical direction DR4. After this etching process has been completed, the remaining portion of the pre-bit-line contact (145p in FIG. 6), the remaining portion of the second pre-conductive layer (141p in FIG. 6), the remaining portion of the third pre-conductive layer (142p in FIG. 6), and the remaining portion of the pre-bit-line capping layer (143p in FIG. 6) may respectively form the bit-line contact 145, the first conductive layer 141, the second conductive layer 142, and the bit-line capping pattern 143. Further, a combination of the first conductive layer 141, the second conductive layer 142, and the bit-line capping pattern 143 may constitute the bit-line structure 140.

Figure 8:
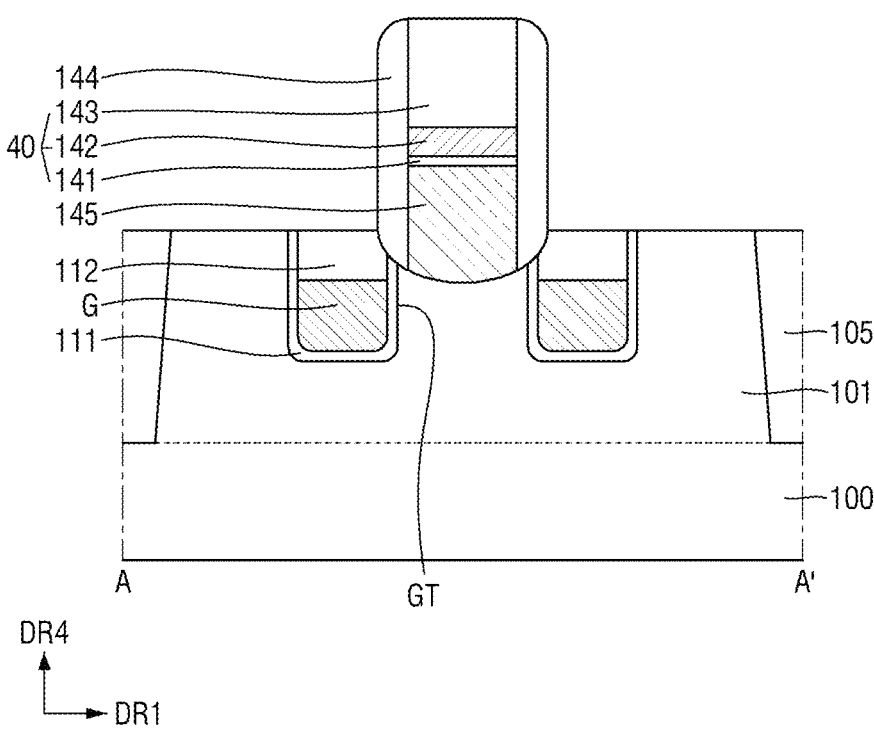

Referring to FIG. 8, a bit-line spacer 144 extending in the third horizontal direction (DR3 in FIG. 1) may be formed along and on each of both opposing sidewalls of each of the bit-line contact 145 and the bit-line structure 140.

Figure 9:
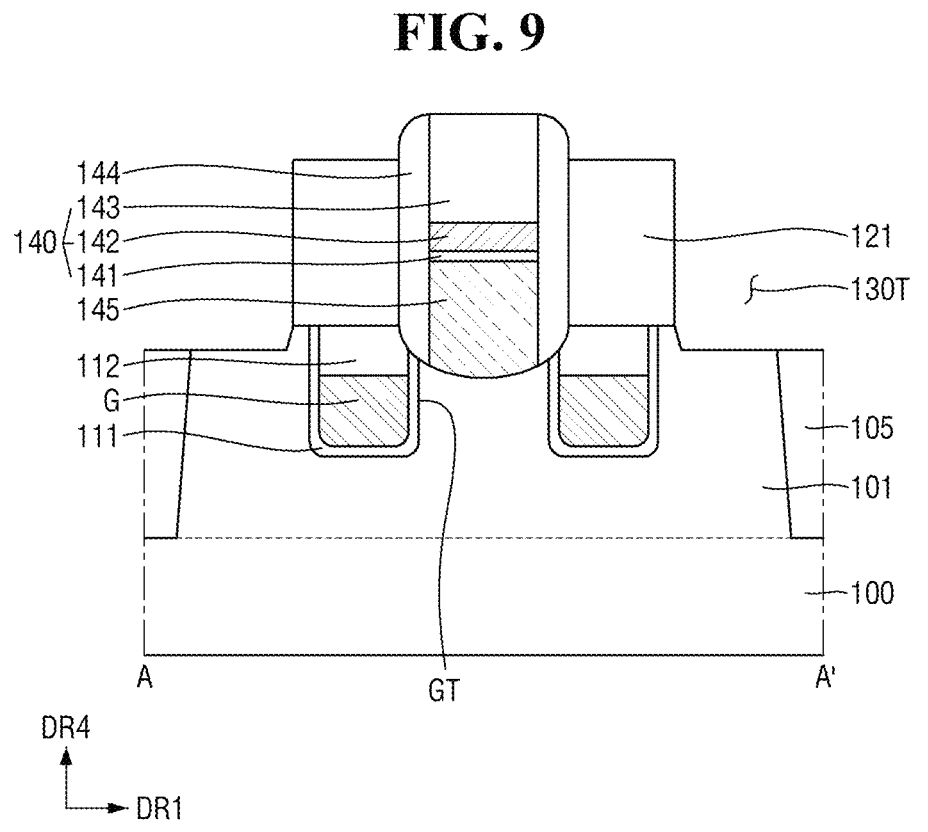

Referring to FIG. 9, the first interlayer insulating layer 121 may be formed so as to cover the active pattern 101, the element isolation layer 105, and the gate capping pattern 112. For example, the first interlayer insulating layer 121 may surround a sidewall of the bit-line spacer 144. Then, a storage contact trench 130T may be formed by etching a portion of the first interlayer insulating layer 121 formed on an edge/end portion in the first horizontal direction DR1 of the active pattern 101. For example, the storage contact trench 130T may extend into each of the active pattern 101 and the element isolation layer 105.

Figure 10:
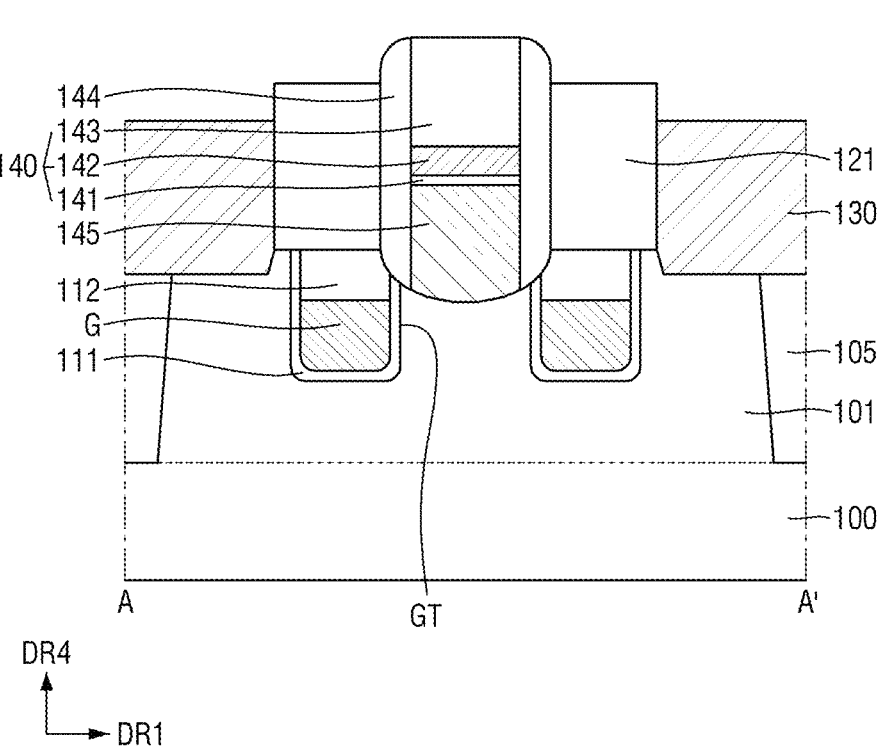

Referring to FIG. 10, the storage contact 130 may be formed inside the storage contact trench 130T. For example, a vertical level of a top surface of the storage contact 130 may be lower than that of a top surface of the first interlayer insulating layer 121. However, the present disclosure is not limited thereto.

Figure 11:
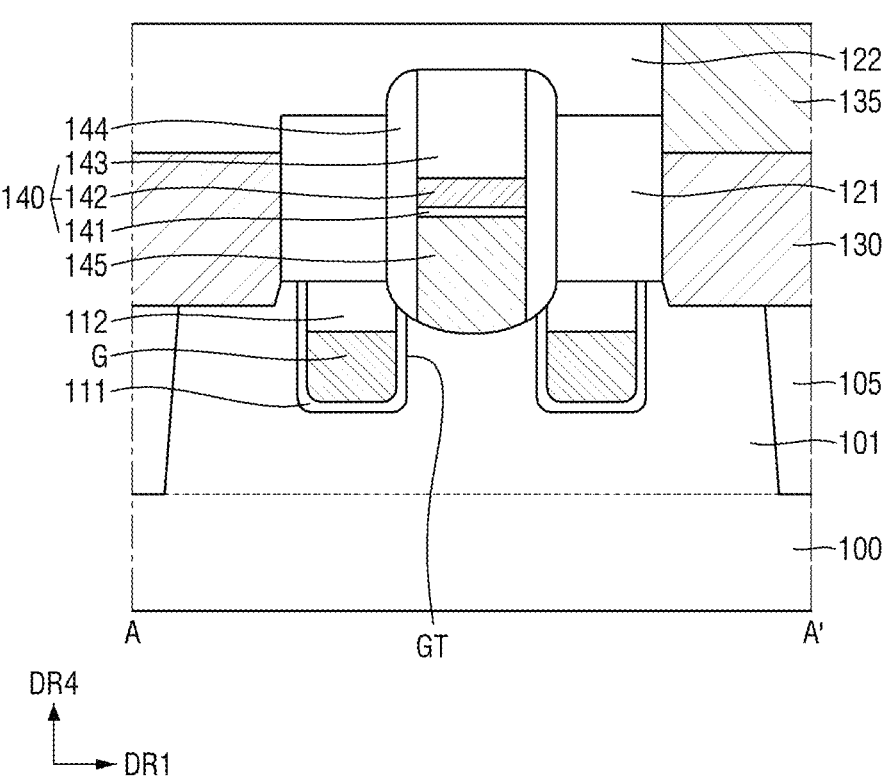

Referring to FIG. 11, the second interlayer insulating layer 122 may be formed on the first interlayer insulating layer 121 so as to cover the bit-line capping pattern 143, the bit-line spacer 144, and the storage contact 130. Further, the storage pad 135 may be formed inside the second interlayer insulating layer 122. The storage pad 135 may contact the storage contact 130. For example, a top surface of the storage pad 135 may be coplanar with a top surface of the second interlayer insulating layer 122.

Figure 12:
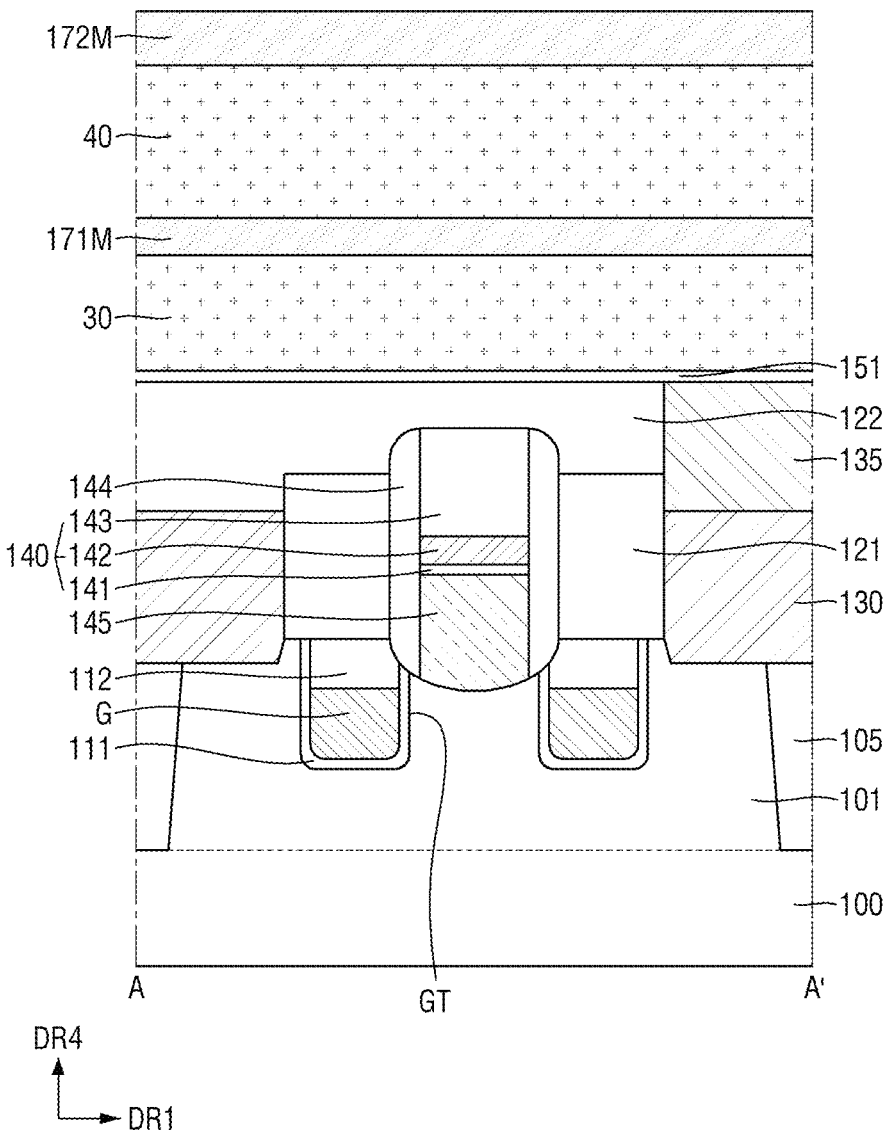

Referring to FIG. 12, the first etch stop layer 151, a first molding layer 30, a first supporter material layer 171M, a second molding layer 40, and a second supporter material layer 172M may be sequentially formed on each of the top surface of the storage pad 135 and the top surface of the second interlayer insulating layer 122. Each of the first supporter material layer 171M and the second supporter material layer 172M may include, for example, at least one of silicon oxynitride (SiON), silicon nitride (SiN), silicon carbon nitride (SiCN), and/or tantalum oxide (TaO). Each of the first molding layer 30 and the second molding layer 40 may include, for example, silicon oxide (SiO$_2$). Each of the first molding layer 30 and the second molding layer 40 may include, for example, at least one of FOX (Flowable Oxide), TOSZ (Tonen SilaZen), USG (Undoped Silica Glass), BSG (Borosilica Glass), PSG (PhosphoSilaca Glass), BPSG (BoroPhosphoSilica Glass), PE-TEOS (Plasma Enhanced Tetra Ethyl Ortho Silicate), FSG (Fluoride Silicate Glass), and/or a combination thereof.

Figure 13:
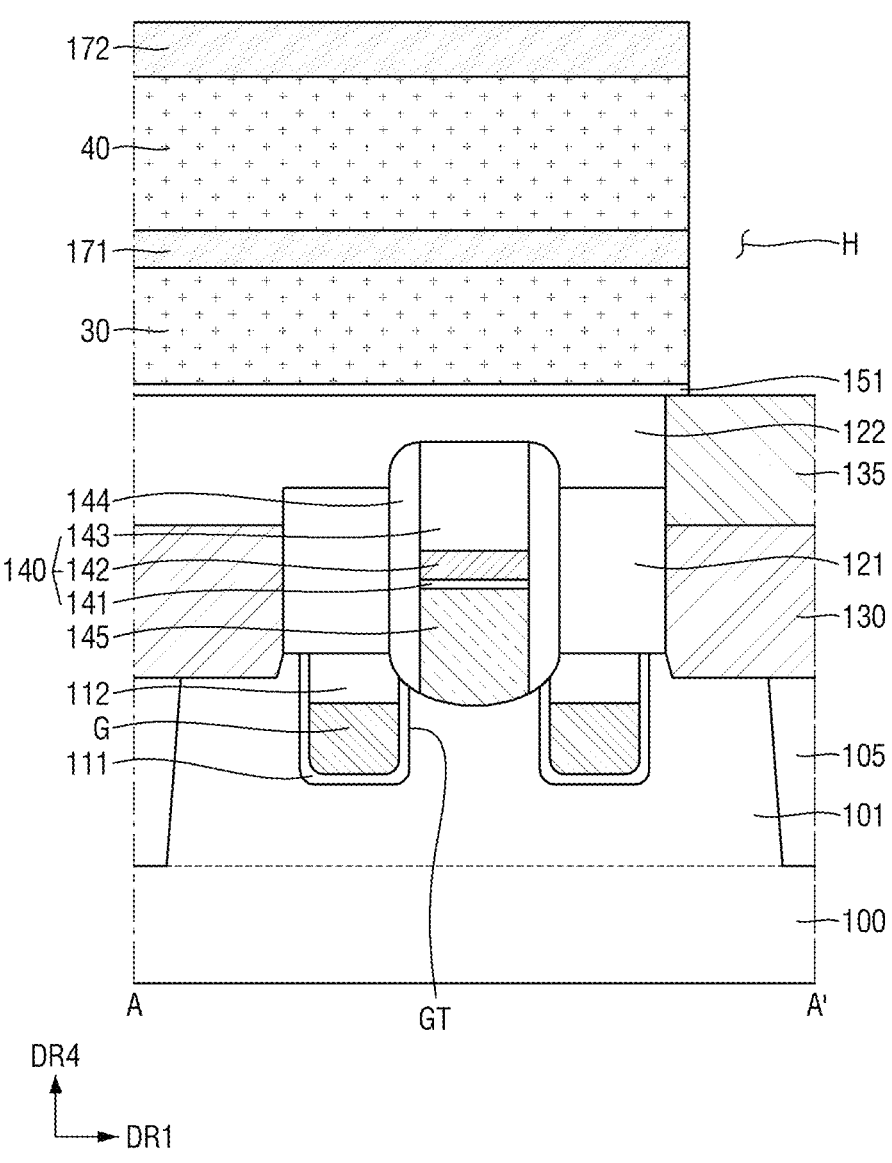

Referring to FIG. 13, the lower electrode hole H may be formed on the storage pad 135 so as to extend through the first etch stop layer 151, the first molding layer 30, the first supporter material layer (171M in FIG. 12), the second molding layer 40, and the second supporter material layer (172M in FIG. 12) in the vertical direction DR4. The top surface of the storage pad 135 may be exposed through the lower electrode hole H. After the lower electrode hole H is formed, the remaining portion of the first supporter material layer (171M in FIG. 12) may become/form the first supporter pattern 171, and the remaining portion of the second supporter material layer (172M in FIG. 12) may become/form the second supporter pattern 172.

Figure 14:
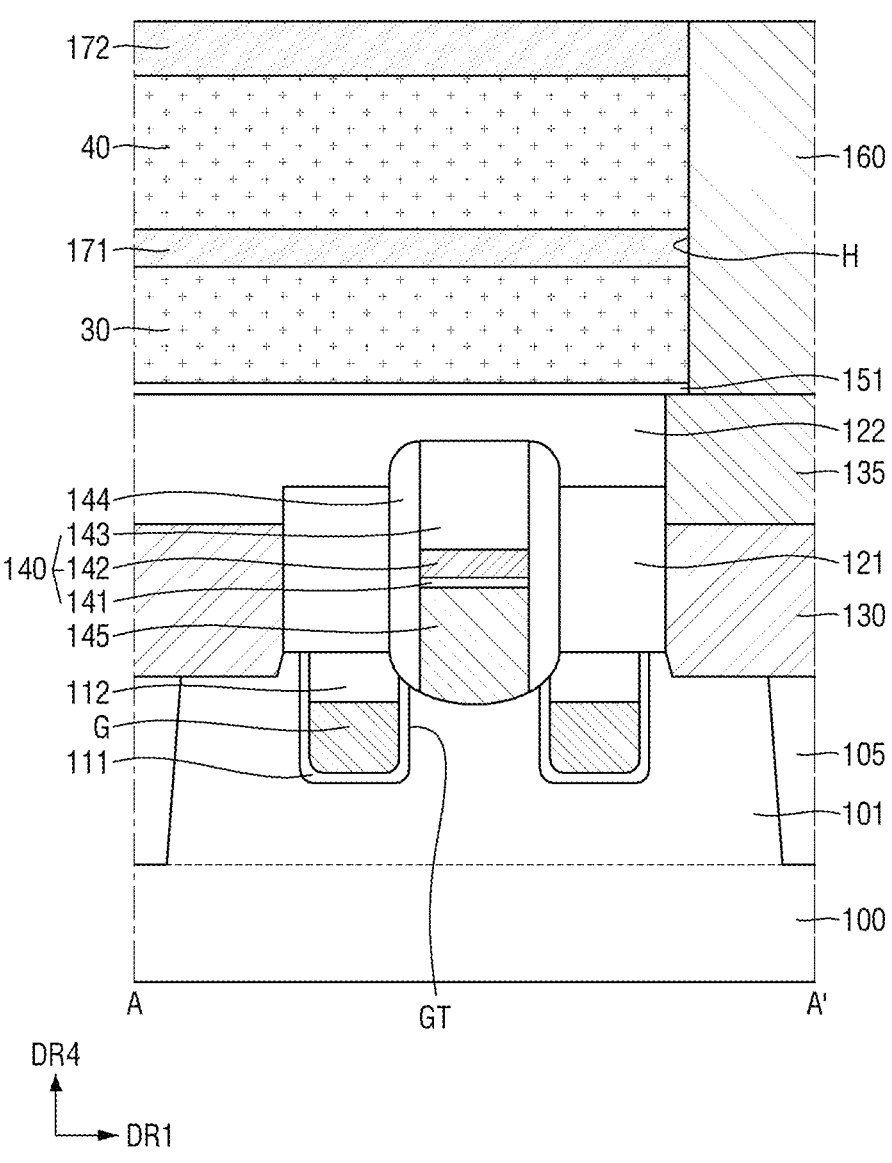

Referring to FIG. 14, the lower electrode 160 may be formed inside the lower electrode hole H. For example, the lower electrode 160 may fill the entirety of the inside of the lower electrode hole H. For example, the top surface of the lower electrode 160 may be coplanar with the top surface of the second supporter pattern 172.

Figure 15:
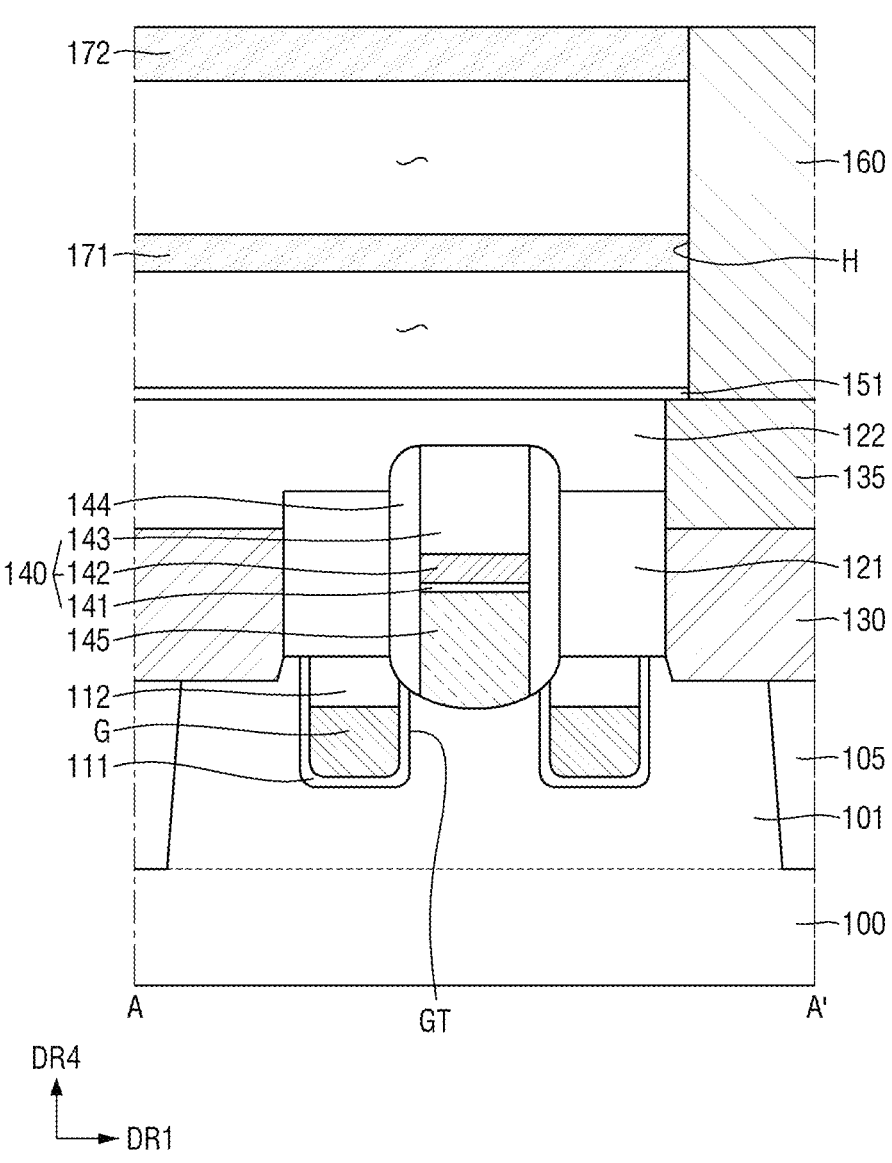

Referring to FIG. 15, each of the first molding layer (30 in FIG. 14) and the second molding layer (40 in FIG. 14) may be removed. For example, each of the first molding layer (30 in FIG. 14) and the second molding layer (40 in FIG. 14) may be etched using a wet etching process.

Figure 16:
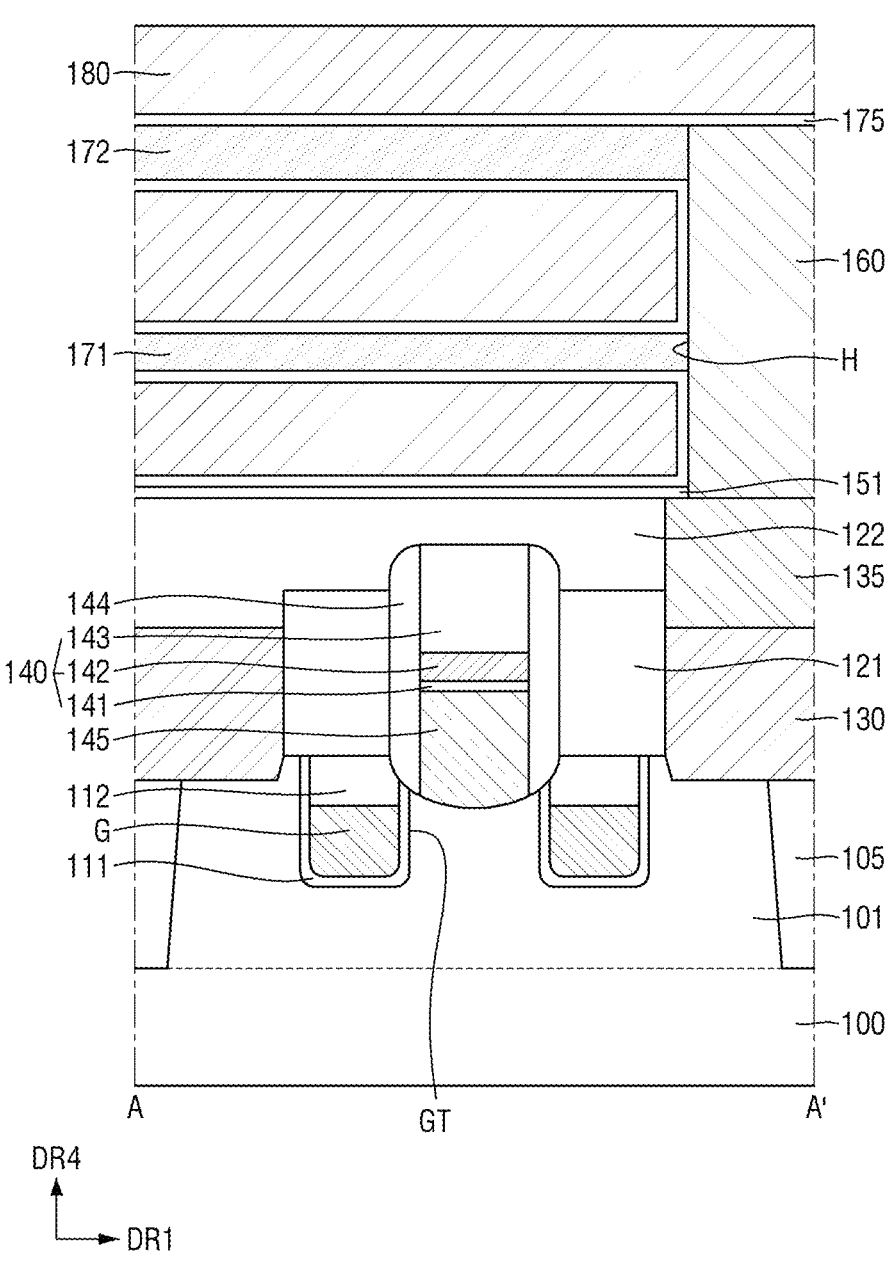

Referring to FIG. 16, the capacitor dielectric layer 175 may be formed on each of an exposed surface of the first etch stop layer 151, an exposed surface of the lower electrode 160, an exposed surface of the first supporter pattern 171, and an exposed surface of the second supporter pattern 172. For example, the capacitor dielectric layer 175 may be conformally formed, e.g., on the above mentioned exposed surfaces. Then, the upper electrode 180 may be formed on the capacitor dielectric layer 175. The upper electrode 180 may surround each of the lower electrode 160, the first supporter pattern 171, and the second supporter pattern 172.

Figure 17:
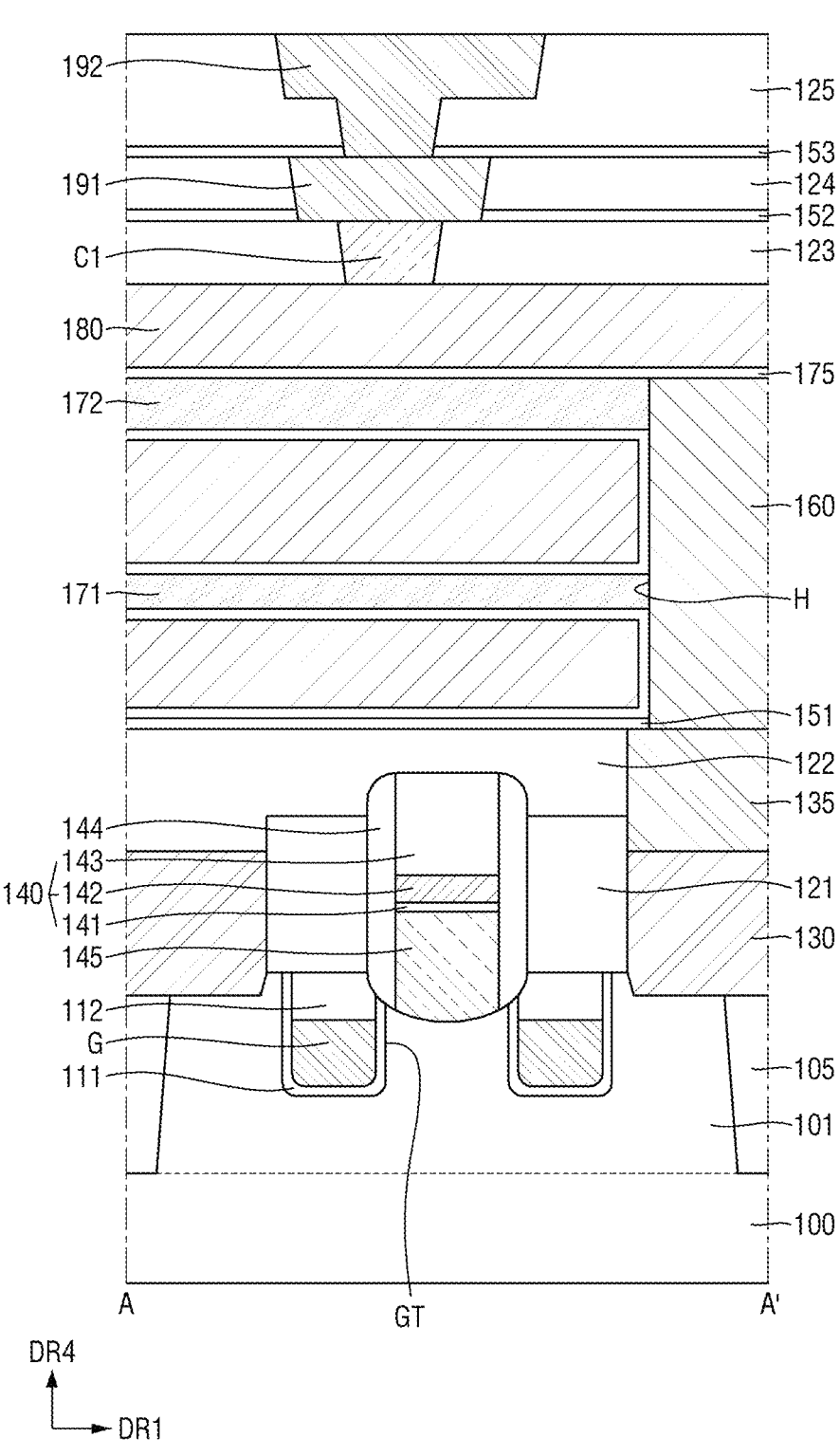

Referring to FIG. 17, the third interlayer insulating layer 123 may be formed on the upper electrode 180. Then, the first contact C1 may be formed so as to extend through the third interlayer insulating layer 123 in the vertical direction DR4 and then to be electrically connected to (e.g., contact) the upper electrode 180. Subsequently, the second etch stop layer 152 and the fourth interlayer insulating layer 124 may be sequentially formed on the third interlayer insulating layer 123 and the first contact C1. Subsequently, the first wiring pattern 191 may be formed inside each of the second etch stop layer 152 and the fourth interlayer insulating layer 124. The first wiring pattern 191 may be electrically connected to (e.g., contact) the first contact C1.

Subsequently, the third etch stop layer 153 and the fifth interlayer insulating layer 125 may be sequentially formed on the first wiring pattern 191 and the fourth interlayer insulating layer 124. Subsequently, the second wiring pattern 192 may be formed inside each of the third etch stop layer 153 and the fifth interlayer insulating layer 125. The second wiring pattern 192 may be electrically connected to (e.g., contact) the first wiring pattern 191.

Figure 18:
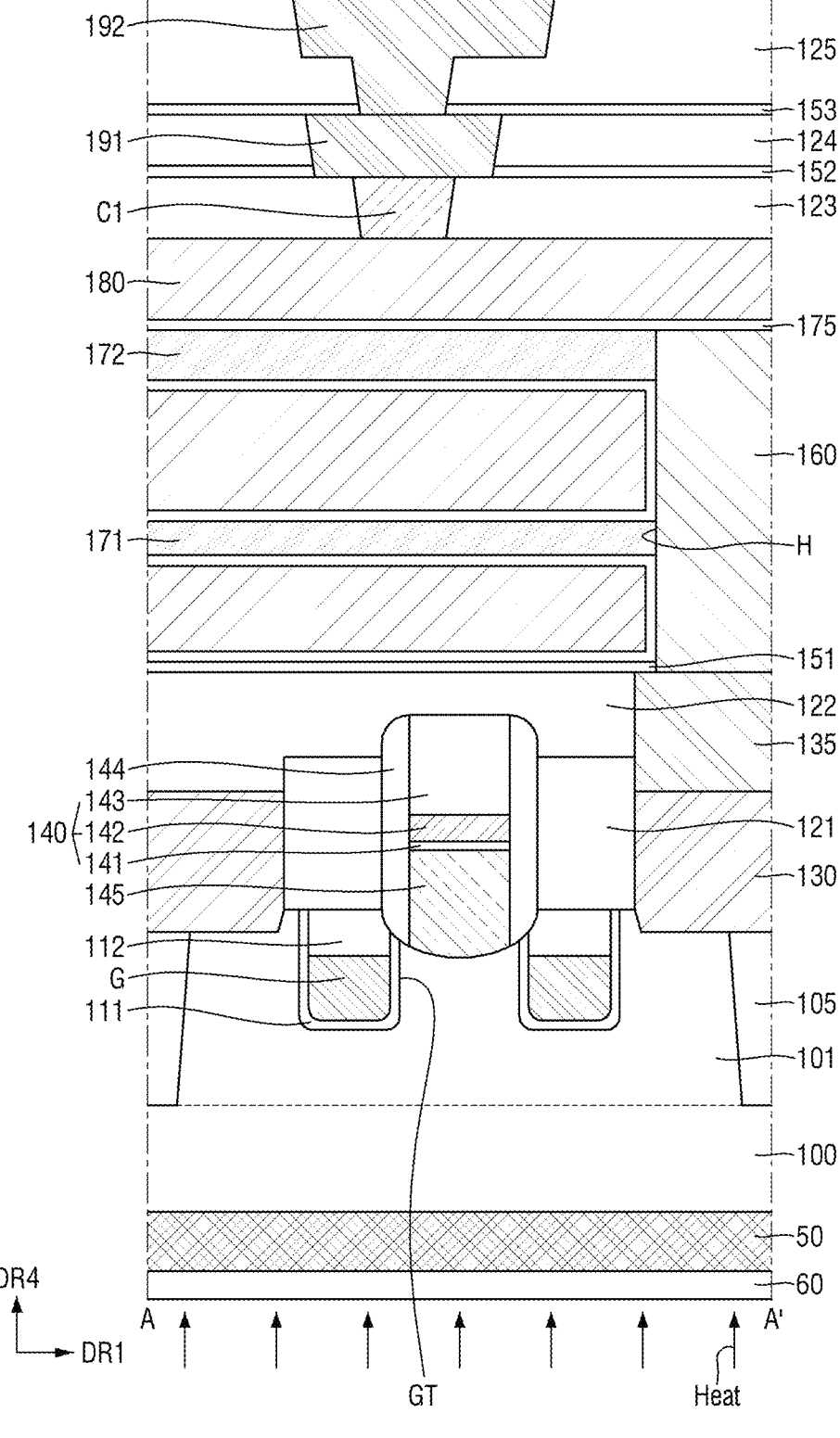

Referring to FIG. 18, a deuterium-containing layer 50 and a passivation layer 60 may be formed on a bottom surface of the substrate 100. For example, the deuterium-containing layer 50 may include silicon oxide (SiO$_2$) as a base material. The deuterium-containing layer 50 may contain deuterium. For example, the deuterium-containing layer 50 may include at least one of silicon nitride (SiN), silicon oxynitride (SiON), silicon carbonitride (SiCN), or silicon oxycarbonitride (SiOCN).

Subsequently, an annealing process (Heat—a heating process) may be performed on the passivation layer 60 and the deuterium-containing layer 50 toward the substrate 100. Via the annealing process (Heat), deuterium contained in the deuterium-containing layer 50 may diffuse toward the substrate 100. The deuterium may also diffuse into other layers/patterns formed on the substrate 100. For example, after the annealing process (Heat) has been completed, the second concentration of deuterium contained in the gate insulating layer 111 may be lower than the first concentration of deuterium contained in the substrate 100. Further, the third concentration of deuterium contained in the capacitor dielectric layer 175 may be lower than the second concentration of deuterium contained in the gate insulating layer 111. Further, the fourth concentration of deuterium contained in the first wiring pattern 191 may be lower than the third concentration of deuterium contained in the capacitor dielectric layer 175.

In this regard, each of the first to fourth concentrations may be a concentration (e.g., quantity/mass/number) of deuterium atoms contained in the same unit volume (e.g., in the same size of unit volume).

Subsequently, after the annealing process (Heat) has been completed, the deuterium-containing layer 50 and the passivation layer 60 may be removed. In this manufacturing process, the semiconductor device shown in FIG. 2 may be manufactured.

In the semiconductor device according to some embodiments of the present disclosure, an upper wiring layer including the first and second wiring patterns 191 and 192 is formed, and then the annealing process (Heat) of diffusing deuterium toward the substrate 100 is performed using the deuterium-containing layer 50 disposed on the bottom surface of the substrate 100. Via this annealing process (Heat), deuterium may be diffused in the substrate 100, the gate insulating layer 111, the capacitor dielectric layer 175, and the first wiring pattern 191 such that the concentrations of deuterium respectively contained in the substrate 100, the gate insulating layer 111, the capacitor dielectric layer 175, and the first wiring pattern 191 may be decreased in this order. Thus, in the semiconductor device according to some embodiments of the present disclosure, the first and second wiring patterns 191 and 192 as the upper wiring layer may be prevented from being deteriorated under the annealing process (Heat) for diffusing deuterium, thereby lowering GIDL (Gate Induced Drain Leakage).

Hereinafter, a semiconductor device according to some embodiments of the present disclosure will be described with reference to FIG. 19 to FIG. 21.

Figure 19:
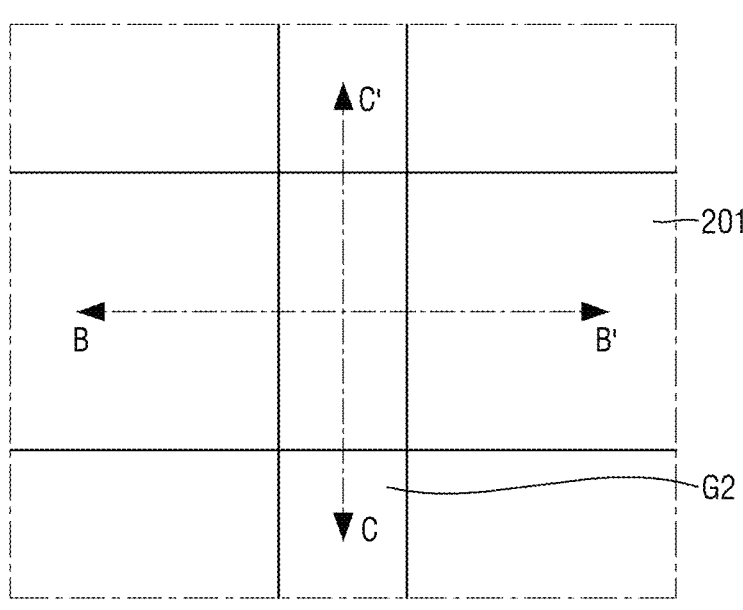
FIG. 19 is a layout diagram for illustrating a semiconductor device according to some embodiments of the present disclosure.
Figure 19:
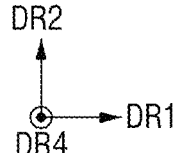

FIG. 19 is a layout diagram for illustrating a semiconductor device according to some embodiments of the present disclosure. FIG. 20 is a cross-sectional view taken along a line B-B' in FIG. 19. FIG. 21 is a cross-sectional view taken along a line C-C' in FIG. 19.

Figure 20:
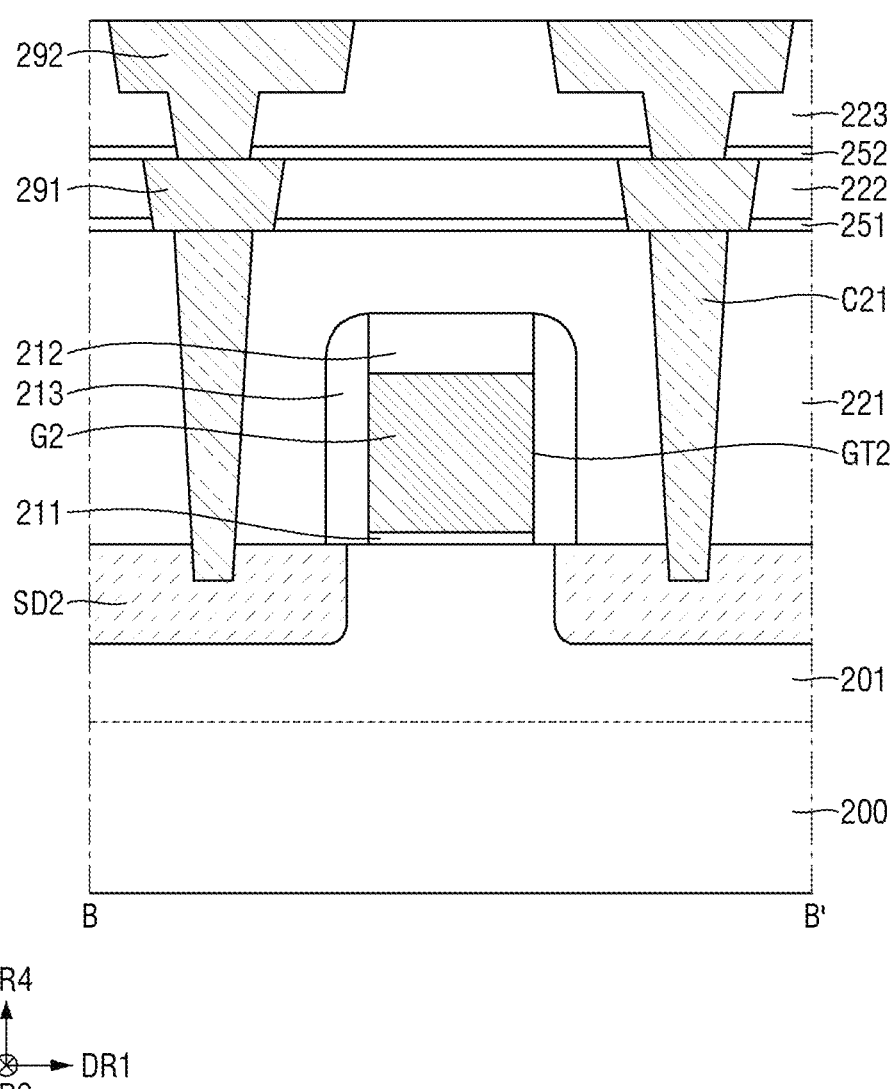
FIG. 20 is a cross-sectional view taken along a line B-B' in FIG. 19.
Figure 21:
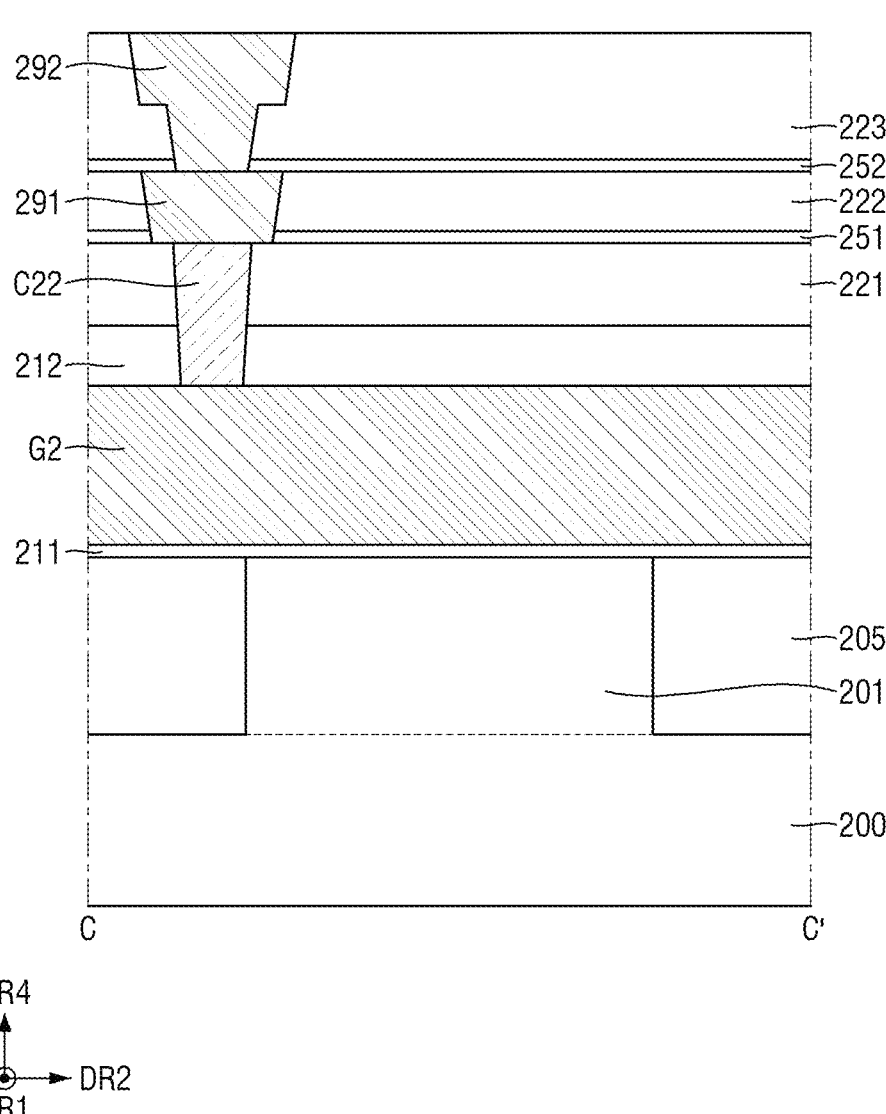
FIG. 21 is a cross-sectional view taken along a line C-C' in FIG. 19.

Referring to FIG. 19 to FIG. 21, the semiconductor device according to some embodiments of the present disclosure may have a planar FET structure. For example, the semiconductor device according to some embodiments of the present disclosure may include a substrate 200, an active pattern 201, a field insulating layer 205, a gate insulating layer 211, a gate electrode G2, a gate capping pattern 212, a gate spacer 213, a source/drain region SD2, first to third interlayer insulating layers 221, 222, and 223, a first contact C21, a second contact C22, first and second etch stop layers 251 and 252, and first and second wiring patterns 291 and 292.

The substrate 200 may be a silicon substrate or a silicon-on-insulator (SOI) substrate. Alternatively, the substrate 200 may include silicon germanium, silicon germanium on insulator (SGOI), indium antimonide, a lead telluride compound, indium arsenide, indium phosphide, gallium arsenide, or gallium antimonide. However, the present disclosure is not limited thereto. For example, the substrate 200 may include deuterium at a first concentration. In this regard, the first concentration may be a concentration (e.g., quantity/mass/number) of deuterium atoms contained in a unit volume.

The active pattern 201 may extend in the first horizontal direction DR1 while being disposed on the substrate 200. The active pattern 201 may protrude from the substrate 200 in the vertical direction DR4. The field insulating layer 205 may surround a sidewall of the active pattern 201 while being disposed on the substrate 200. For example, a top surface of the active pattern 201 may be coplanar with a top surface of the field insulating layer 205. The field insulating layer 205 may include, for example, at least one of a silicon oxide film, a silicon nitride film, and/or a silicon oxynitride film. However, the present disclosure is not limited thereto.

The gate spacer 213 may extend in the second horizontal direction DR2 while being disposed on the active pattern 201 and the field insulating layer 205. For example, the semiconductor device according to the embodiments may include two gate spacers 213 spaced apart from each other in the first horizontal direction DR1 and disposed on opposite sidewalls of the gate electrode G2. For example, the gate spacers 213 may include, for example, at least one of silicon nitride (SiN), silicon oxynitride (SiON), silicon carbonitride (SiCN), silicon oxycarbonitride (SiOCN), silicon boron nitride (SiBN), silicon oxyboron nitride (SiOBN), silicon oxycarbide (SiOC), and/or a combination thereof. However, the present disclosure is not limited thereto.

A gate trench GT2 may be a space defined by and surrounded with the gate spacers 213 while being disposed on the active pattern 201 and the field insulating layer 205. For example, the gate trench GT2 may extend in the second horizontal direction DR2 while being disposed on the active pattern 201 and the field insulating layer 205. The gate electrode G2 may be disposed inside the gate trench GT2. For example, the gate electrode G2 may extend in the second horizontal direction DR2 while being disposed on the active pattern 201 and the field insulating layer 205. Each of both opposing sidewalls in the first horizontal direction DR1 of the gate electrode G2 may contact a corresponding gate spacer 213. For example, the gate electrode G2 may include or be formed of the same material as that of the gate electrode G shown in FIG. 2.

The gate insulating layer 211 may be disposed along a bottom surface of the gate trench GT2. The gate insulating layer 211 may be disposed between the active pattern 201 and the gate electrode G2 and inside the gate trench GT2. Further, the gate insulating layer 211 may be disposed between the field insulating layer 205 and the gate electrode G2 while being disposed inside the gate trench GT2. For example, the gate insulating layer 211 may contain deuterium at a second concentration. The second concentration of deuterium contained in the gate insulating layer 211 may be lower than the first concentration of deuterium contained in the substrate 200. In this regard, the second concentration may be a concentration (e.g., quantity/mass/number) of deuterium atoms contained in a unit volume. The unit volume for the second concentration may be the same volume as the unit volume for the first concentration. For example, the gate insulating layer 211 may include or be formed of the same material as that of the gate insulating layer 111 shown in FIG. 2.

The gate capping pattern 212 may be disposed on the gate electrode G2 and inside the gate trench GT2. The gate capping pattern 212 may extend in the second horizontal direction DR2. For example, the gate capping pattern 212 may include or be formed of the same material as that of the gate capping pattern 112 shown in FIG. 2. The source/drain region SD2 may be disposed on at least one side of the gate electrode G2 in the first horizontal direction DR1 while being disposed on the active pattern 201. For example, the source/drain region SD2 may be formed by performing an ion implantation process into the active pattern 201. For example, a top surface of the source/drain region SD2 may be coplanar with a top surface of the active pattern 201.

The first interlayer insulating layer 221 may cover the gate spacer 213 and the gate capping pattern 212 while being disposed on the active pattern 201, the field insulating layer 205, and the source/drain region SD2. The first interlayer insulating layer 221 may include, for example, at least one of silicon oxide (SiO$_2$), silicon nitride (SiN), silicon oxynitride (SiON), tetraethyl orthosilicate (TEOS), and/or a low dielectric constant (low-k) material. The first contact C21 may extend through the first interlayer insulating layer 221 in the vertical direction DR4 and then be electrically connected to (e.g., contact) the source/drain region SD2. The second contact C22 may extend through the first interlayer insulating layer 221 and the gate capping pattern 212 in the vertical direction DR4 and then be electrically connected to (e.g., contact) the gate electrode G2. Each of the first contact C21 and the second contact C22 may include a conductive material. FIG. 20 and FIG. 21 illustrate that each of the first contact C21 and the second contact C22 is formed as a single film. However, this is intended for convenience of illustration, and the present disclosure is not limited thereto. For example, each of the first contact C21 and the second contact C22 may be formed as a stack of multiple films.

The first etch stop layer 251 may be disposed on the first interlayer insulating layer 221. For example, the first etch stop layer 251 may be conformally formed. The first etch stop layer 251 may include, for example, at least one of silicon oxide, silicon nitride, silicon oxynitride, aluminum oxide, aluminum nitride, aluminum oxynitride, and/or a low dielectric constant (low-k) material. The second interlayer insulating layer 222 may be disposed on the first etch stop layer 251. The second interlayer insulating layer 222 may include, for example, at least one of silicon oxide (SiO$_2$), silicon nitride (SiN), silicon oxynitride (SiON), tetraethyl orthosilicate (TEOS), and/or a low dielectric constant (low-k) material.

The first wiring pattern 291 may be disposed inside each of the first etch stop layer 251 and the second interlayer insulating layer 222. The first wiring pattern 291 may be electrically connected to (e.g., contact) one of the first contact C21 and the second contact C22. For example, a portion of the first wiring pattern 291 electrically connected to the first contact C21 may be spaced apart from a portion of the first wiring pattern 291 electrically connected to the second contact C22. For example, the first wiring pattern 291 may contain deuterium at a third concentration. The third concentration of deuterium contained in the first wiring pattern 291 may be lower than the first concentration of deuterium contained in the substrate 200. Further, the third concentration of deuterium contained in the first wiring pattern 291 may be lower than the second concentration of deuterium contained in the gate insulating layer 211. In this regard, the third concentration may be a concentration (e.g., quantity/mass/number) of deuterium atoms contained in a unit volume. The unit volume for the third concentration may be the same volume as the unit volume for each of the first concentration and the second concentration.

The first wiring pattern 291 may include a conductive material. FIG. 20 and FIG. 21 illustrate that the first wiring pattern 291 is formed as a single film. However, this is intended for convenience of illustration, and the present disclosure is not limited thereto. For example, the first wiring pattern 291 may be formed as a stack of multiple films.

The second etch stop layer 252 may be disposed on the second interlayer insulating layer 222. For example, the second etch stop layer 252 may be conformally formed. The second etch stop layer 252 may include, for example, at least one of silicon oxide, silicon nitride, silicon oxynitride, aluminum oxide, aluminum nitride, aluminum oxynitride, and/or a low dielectric constant (low-k) material. The third interlayer insulating layer 223 may be disposed on the second etch stop layer 252. The third interlayer insulating layer 223 may include, for example, at least one of silicon oxide (SiO2), silicon nitride (SiN), silicon oxynitride (SiON), tetraethyl orthosilicate (TEOS), and/or a low dielectric constant (low-k) material.

The second wiring pattern 292 may be disposed inside each of the second etch stop layer 252 and the third interlayer insulating layer 223. The second wiring pattern 292 may be electrically connected to (e.g., contact) the first wiring pattern 291. The second wiring pattern 292 may include a conductive material. FIG. 20 and FIG. 21 illustrate that the second wiring pattern 292 is formed as a single film. However, this is intended for convenience of illustration, and the present disclosure is not limited thereto. For example, the second wiring pattern 292 may be formed as a stack of multiple films.

In the semiconductor device according to some embodiments of the present disclosure as shown in FIG. 19 to FIG. 21, the first and second wiring patterns 291 and 292 as an upper wiring layer are formed, and then the annealing process (Heat) of diffusing deuterium toward the substrate 200 is performed using the deuterium-containing layer 50 disposed on the bottom surface of the substrate 200. Via this annealing process (Heat), deuterium may be diffused in the substrate 200, the gate insulating layer 211, and the first wiring pattern 291 such that the concentrations of deuterium respectively contained in the substrate 200, the gate insulating layer 211, and the first wiring pattern 291 may be decreased in this order. Thus, in the semiconductor device according to some embodiments of the present disclosure as shown in FIG. 19 to FIG. 21, the first and second wiring patterns 291 and 292 as the upper wiring layer may be prevented from being deteriorated under the annealing process (Heat) for diffusing deuterium, thereby lowering GIDL (Gate Induced Drain Leakage).

Hereinafter, referring to FIG. 22 to FIG. 24, a semiconductor device according to some embodiments of the present disclosure will be described. Following descriptions are based on differences thereof from the semiconductor device shown in FIG. 19 to FIG. 21.

Figure 22:
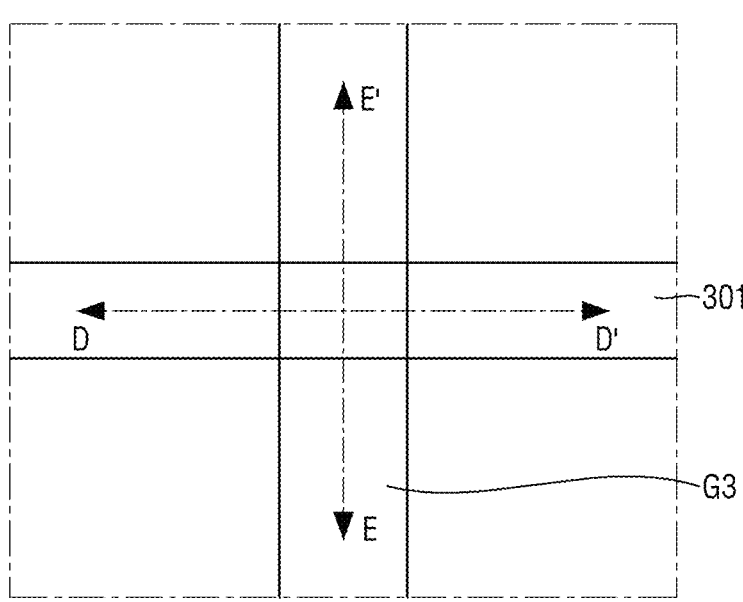
FIG. 22 is a layout diagram for illustrating a semiconductor device according to some embodiments of the present disclosure.
Figure 22:
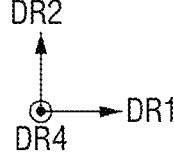

FIG. 22 is a layout diagram for illustrating a semiconductor device according to some embodiments of the present disclosure. FIG. 23 is a cross-sectional view taken along a line D-D' in FIG. 22. FIG. 24 is a cross-sectional view taken along a line E-E' in FIG. 22.

Figure 23:
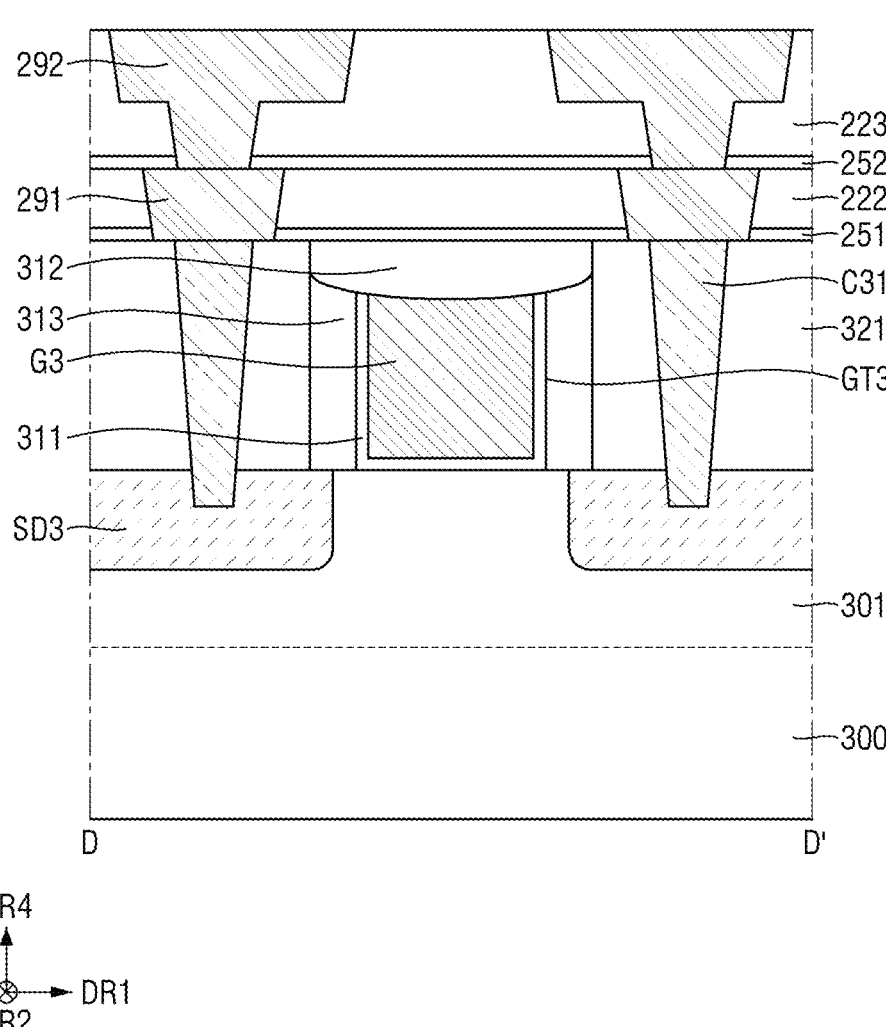
FIG. 23 is a cross-sectional view taken along a line D-D' in FIG. 22.
Figure 24:
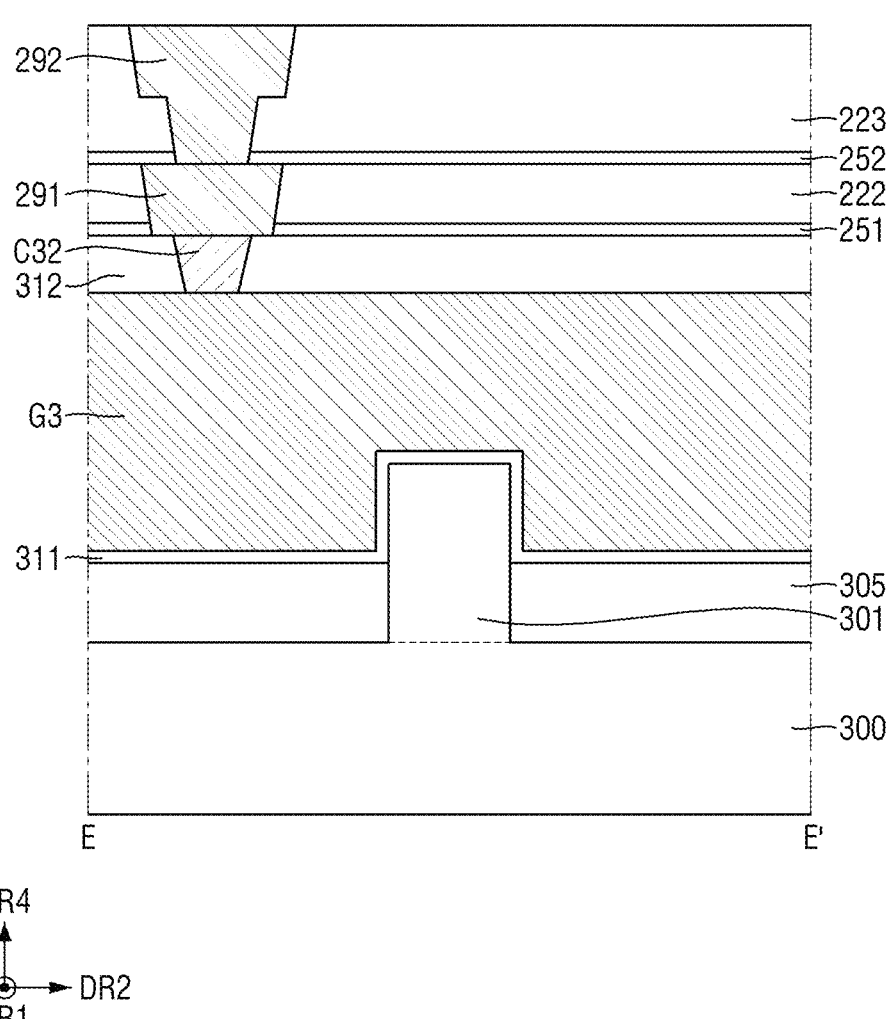
FIG. 24 is a cross-sectional view taken along a line E-E' in FIG. 22.

Referring to FIG. 22 to FIG. 24, the semiconductor device according to some embodiments of the present disclosure may have a FinFET structure. For example, the semiconductor device according to some embodiments of the present disclosure may include a substrate 300, an active pattern 301, a field insulating layer 305, a gate insulating layer 311, a gate electrode G3, a gate capping pattern 312, a gate spacer 313, a source/drain region SD3, first to third interlayer insulating layers 321, 222, and 223, a first contact C31, a second contact C32, the first and second etch stop layers 251 and 252, and the first and second wiring patterns 291 and 292.

The substrate 300 may be a silicon substrate or a silicon-on-insulator (SOI) substrate. Alternatively, the substrate 300 may include silicon germanium, silicon germanium on insulator (SGOI), indium antimonide, a lead telluride compound, indium arsenide, indium phosphide, gallium arsenide, or gallium antimonide. However, the present disclosure is not limited thereto. For example, the substrate 300 may include deuterium at a first concentration. In this regard, the first concentration may be a concentration (e.g., quantity/mass/number) of deuterium atoms contained in a unit volume.

The active pattern 301 may extend (e.g., lengthwise) in the first horizontal direction DR1 while being disposed on the substrate 300. The active pattern 301 may protrude from the substrate 300 in the vertical direction DR4. The field insulating layer 305 may surround a sidewall of the active pattern 301 while being disposed on the substrate 300. For example, a top surface of the active pattern 301 may protrude beyond a top surface of the field insulating layer 305 in the vertical direction DR4. The gate spacer 313 may extend (e.g., lengthwise) in the second horizontal direction DR2 while being disposed on the active pattern 301 and the field insulating layer 305. For example, the semiconductor device according to the embodiments may include two gate spacers spaced apart from each other in the first horizontal direction DR1 and disposed on opposite side walls of the gate electrode G3.

A gate trench GT3 may be defined by and surrounded with the gate spacers 313 while being disposed on the active pattern 301 and the field insulating layer 305. The gate insulating layer 311 may be disposed along a sidewall and bottom surface of the gate trench GT3. The gate electrode G3 may be disposed on the gate insulating layer 311 and inside the gate trench GT3. The gate electrode G3 may extend (e.g., lengthwise) in the second horizontal direction DR2 while being disposed on the active pattern 301 and the field insulating layer 305. For example, the gate insulating layer 311 may be disposed between the gate electrode G3 and the gate spacer 313.

For example, the gate insulating layer 311 may contain deuterium at a second concentration. The second concentration of deuterium contained in the gate insulating layer 311 may be lower than the first concentration of deuterium contained in the substrate 300. In this regard, the second concentration may be a concentration (e.g., quantity/mass/number) of deuterium atoms contained in a unit volume. The unit volume for the second concentration may be the same volume as the unit volume for the first concentration.

The gate capping pattern 312 may extend (e.g., lengthwise) in the second horizontal direction DR2 while being disposed on the gate electrode G3, the gate insulating layer 311, and the gate spacer 313. The source/drain region SD3 may be disposed on at least one side of the gate electrode G3 in the first horizontal direction DR1 while being disposed on the active pattern 301. Although not shown, a top surface of the source/drain region SD3 may protrude (e.g., upwardly) beyond the top surface of the field insulating layer 305 in the vertical direction DR4. The first interlayer insulating layer 321 may cover the source/drain region SD3 and the gate spacer 313 while being disposed on the active pattern 301 and the field insulating layer 305. For example, a top surface of the first interlayer insulating layer 321 may be coplanar with a top surface of the gate capping pattern 312. However, the present disclosure is not limited thereto.

The first contact C31 may extend (e.g., lengthwise) though the first interlayer insulating layer 321 in the vertical direction DR4 and then be electrically connected to (e.g., contact) the source/drain region SD3. The second contact C32 may extend (e.g., lengthwise) through the gate capping pattern 312 in the vertical direction DR4 and then be electrically connected to (e.g., contact) the gate electrode G3. The second interlayer insulating layer 222, the third interlayer insulating layer 223, the first etch stop layer 251, the second etch stop layer 252, the first wiring pattern 291, and the second wiring pattern 292 shown in FIG. 22 to FIG. 24 may have the same structures respectively as those of the second interlayer insulating layer 222, the third interlayer insulating layer 223, the first etch stop layer 251, the second etch stop layer 252, the first wiring pattern 291, and the second wiring pattern 292 shown in FIG. 19 to FIG. 21.

For example, the first wiring pattern 291 may contain deuterium at a third concentration. The third concentration of deuterium contained in the first wiring pattern 291 may be lower than the first concentration of deuterium contained in the substrate 300. Further, the third concentration of deuterium contained in the first wiring pattern 291 may be lower than the second concentration of deuterium contained in the gate insulating layer 311. In this regard, the third concentration may be a concentration (e.g., quantity/mass/number) of deuterium atoms contained in a unit volume. The unit volume for the third concentration may be the same volume as the unit volume for each of the first concentration and the second concentration.

Hereinafter, referring to FIG. 25 to FIG. 27, a semiconductor device according to some embodiments of the present disclosure will be described. Following descriptions are based on differences thereof from the semiconductor device shown in FIG. 19 to FIG. 21.

Figure 25:
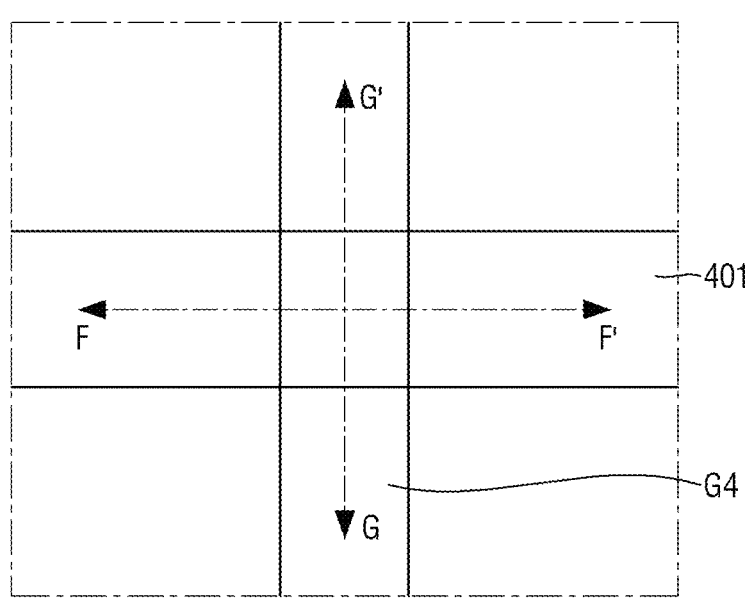
FIG. 25 is a layout diagram for illustrating a semiconductor device according to some embodiments of the present disclosure.
Figure 25:
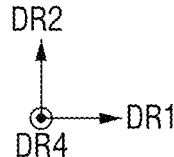

FIG. 25 is a layout diagram for illustrating a semiconductor device according to some embodiments of the present disclosure. FIG. 26 is a cross-sectional view taken along a line F-F' in FIG. 25. FIG. 27 is a cross-sectional view taken along a line G-G' in FIG. 25.

Figure 26:
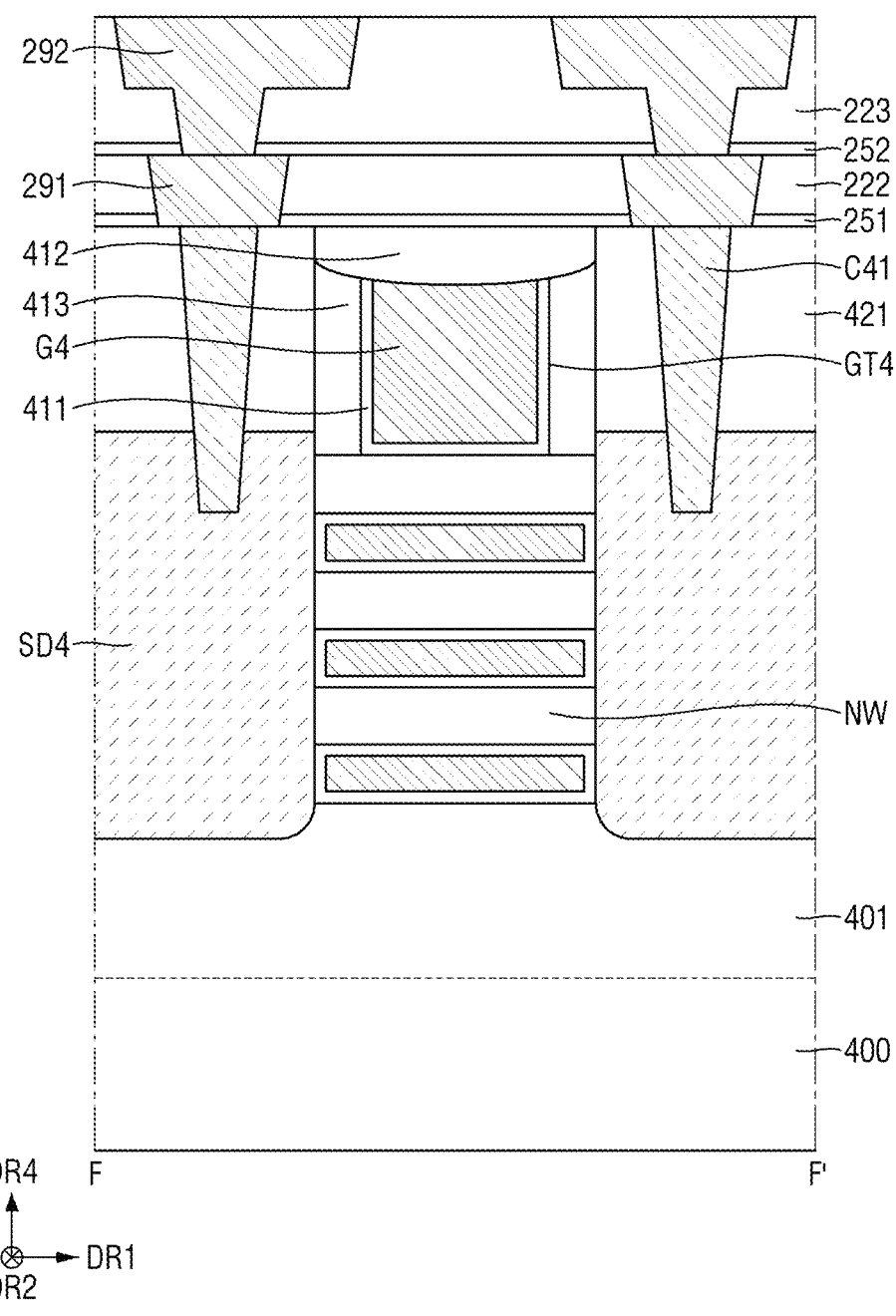
FIG. 26 is a cross-sectional view taken along a line F-F' in FIG. 25.
Figure 27:
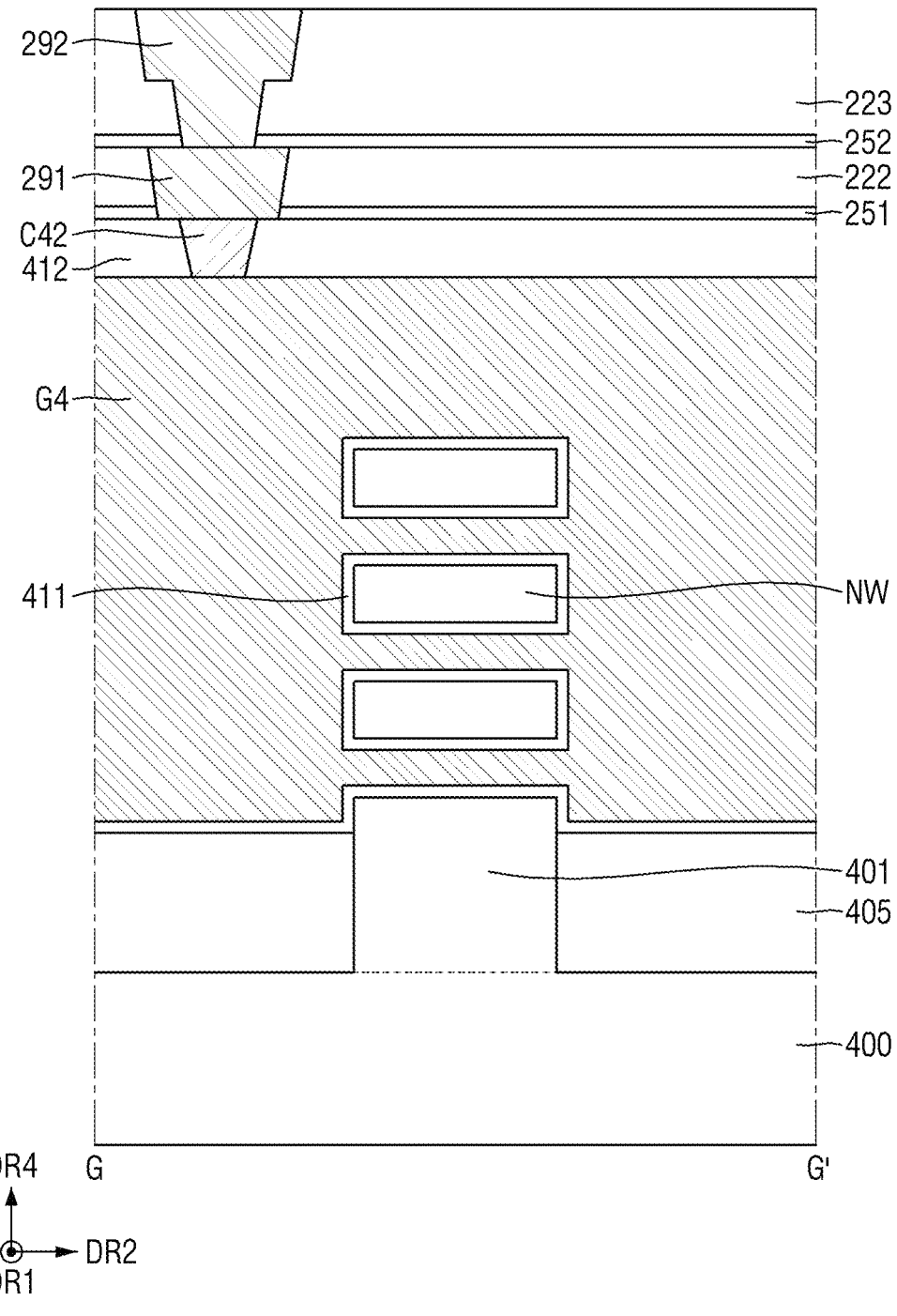
FIG. 27 is a cross-sectional view taken along a line G-G' in FIG. 25.

Referring to FIG. 25 to FIG. 27, the semiconductor device according to some embodiments of the present disclosure may have a Multi-Bridge Channel Field Effect Transistor (MBCFET™) structure. For example, the semiconductor device according to some embodiments of the present disclosure may include a substrate 400, an active pattern 401, a plurality of nanosheets NW, a field insulating layer 405, a gate insulating layer 411, a gate electrode G4, a gate capping pattern 412, a gate spacer 413, a source/drain region SD4, first to third interlayer insulating layers 421, 222, and 223, a first contact C41, a second contact C42, the first and second etch stop layers 251 and 252, and the first and second wiring patterns 291 and 292.

The substrate 400 may be a silicon substrate or a silicon-on-insulator (SOI) substrate. Alternatively, the substrate 400 may include silicon germanium, silicon germanium on insulator (SGOI), indium antimonide, a lead telluride compound, indium arsenide, indium phosphide, gallium arsenide, or gallium antimonide. However, the present disclosure is not limited thereto. For example, the substrate 400 may include deuterium at a first concentration. In this regard, the first concentration may be a concentration (e.g., quantity/mass/number) of deuterium atoms contained in a unit volume.

The active pattern 401 may extend (e.g., lengthwise) in the first horizontal direction DR1 while being disposed on the substrate 400. The active pattern 401 may protrude from the substrate 400 in the vertical direction DR4. The field insulating layer 405 may surround a sidewall of the active pattern 401 while being disposed on the substrate 400. For example, a top surface of the active pattern 401 may protrude (e.g., upwardly), in the vertical direction DR4, beyond a top surface of the field insulating layer 405. The plurality of nanosheets NW may include a plurality of nanosheets stacked on top of each other and spaced apart from each other in the vertical direction DR4 while being disposed on the active pattern 401. In FIG. 26 and FIG. 27, it is illustrated that the number of the plurality of nanosheets NW stacked on the active pattern 401 is three. However, the present disclosure is not limited thereto. In some further embodiments, the plurality of nanosheets NW may include four or more nanosheets spaced apart from each other and stacked on top of each other in the vertical direction DR4 while being disposed on the active pattern 401.

A gate spacer 413 may extend (e.g., lengthwise) along each of both opposing sidewalls of the gate electrode G4 in the second horizontal direction DR2 while being disposed on the topmost nanosheet among the plurality of nanosheets NW and the field insulating layer 405. For example, the semiconductor device may include two gate spacers 413 disposed on opposite sidewalls of the gate electrode G4 and spaced apart from each other in the first horizontal direction DR1. A gate trench GT4 may be defined by and surrounded with the gate spacer 413 while being disposed on the active pattern 401 and the field insulating layer 405. The gate electrode G4 may extend (e.g., lengthwise) in the second horizontal direction DR2 and may be disposed inside the gate trench GT4. The gate electrode G4 may surround the plurality of nanosheets NW.

A source/drain region SD4 may be disposed on each of both opposing sidewalls of the gate electrode G4 in the first horizontal direction DR1 while being disposed on the active pattern 401. The gate insulating layer 411 may be disposed between the gate electrode G4 and the field insulating layer 405. The gate insulating layer 411 may be disposed between the gate electrode G4 and the active pattern 401. The gate insulating layer 411 may be disposed between the gate electrode G4 and each of the plurality of nanosheets NW. The gate insulating layer 411 may be disposed between the gate electrode G4 and the source/drain region SD4. The gate insulating layer 411 may be disposed between the gate electrode G4 and the gate spacer 413.

For example, the gate insulating layer 411 may contain deuterium at a second concentration. The second concentration of deuterium contained in the gate insulating layer 411 may be lower than the first concentration of deuterium contained in the substrate 400. In this regard, the second concentration may be a concentration (e.g., quantity/mass/number) of deuterium atoms contained in a unit volume. The unit volume for the second concentration may be the same volume as the unit volume for the first concentration.

The gate capping pattern 412 may extend (e.g., lengthwise) in the second horizontal direction DR2 while being disposed on the gate electrode G4, the gate insulating layer 411, and the gate spacer 413. The first interlayer insulating layer 421 may cover the source/drain region SD4 and the gate spacer 413 while being disposed on the active pattern 401 and the field insulating layer 405. For example, a top surface of the first interlayer insulating layer 421 may be coplanar with a top surface of the gate capping pattern 412. However, the present disclosure is not limited thereto.

The first contact C41 may extend (e.g., lengthwise) through the first interlayer insulating layer 421 in the vertical direction DR4 and then be electrically connected to (e.g., contact) the source/drain region SD4. The second contact C42 may extend through the gate capping pattern 412 in the vertical direction DR4 and then be electrically connected to (e.g., contact) the gate electrode G4. The second interlayer insulating layer 222, the third interlayer insulating layer 223, the first etch stop layer 251, the second etch stop layer 252, the first wiring pattern 291, and the second wiring pattern 292 as shown FIG. 25 to FIG. 27 may have the same structures respectively as those of the second interlayer insulating layer 222, the third interlayer insulating layer 223, the first etch stop layer 251, the second etch stop layer 252, the first wiring pattern 291, and the second wiring pattern 292 shown in FIG. 19 to FIG. 21.

For example, the first wiring pattern 291 may contain deuterium at a third concentration. The third concentration of deuterium contained in the first wiring pattern 291 may be lower than the first concentration of deuterium contained in the substrate 400. Further, the third concentration of deuterium contained in the first wiring pattern 291 may be lower than the second concentration of deuterium contained in the gate insulating layer 411. In this regard, the third concentration may be a concentration (e.g., quantity/mass/number) of deuterium atoms contained in a unit volume. The unit volume for the third concentration may be the same volume as the unit volume for each of the first concentration and the second concentration.

Even though different figures illustrate variations of exemplary embodiments and different embodiments disclose different features from each other, these figures and embodiments are not necessarily intended to be mutually exclusive from each other. Rather, features depicted in different figures and/or described above in different embodiments can be combined with other features from other figures/embodiments to result in additional variations of embodiments, when taking the figures and related descriptions of embodiments as a whole into consideration. For example, components and/or features of different embodiments described above can be combined with components and/or features of other embodiments interchangeably or additionally to form additional embodiments unless the context indicates otherwise.

Although embodiments of the present disclosure have been described with reference to the accompanying drawings, the present disclosure is not limited to the above embodiments, but may be implemented in various different forms. A person skilled in the art may appreciate that the present disclosure may be practiced in other concrete forms without changing the technical spirit or essential characteristics of the present disclosure. Therefore, it should be appreciated that the embodiments as described above is not restrictive but illustrative in all respects.

What is claimed is:

1. A semiconductor device comprising:
   a substrate containing deuterium at a first concentration;
   an active pattern disposed on the substrate and extending in a first horizontal direction;
   a gate electrode disposed on the active pattern and extending in a second horizontal direction different from the first horizontal direction;
   a gate insulating layer disposed between the active pattern and the gate electrode, the gate insulating layer containing deuterium at a second concentration;
   a first interlayer insulating layer disposed on the gate electrode;
   a second interlayer insulating layer disposed on the first interlayer insulating layer; and
   a wiring pattern disposed inside the second interlayer insulating layer, the wiring pattern containing deuterium at a third concentration lower than the first concentration,
   wherein each of the first to third concentrations is a concentration of deuterium atoms contained in the same unit volume.

2. The semiconductor device of claim 1, wherein the second concentration is lower than the first concentration.

3. The semiconductor device of claim 1, wherein the third concentration is lower than the second concentration.

4. The semiconductor device of claim 1, further comprising:
   a lower electrode extending in a vertical direction between the first interlayer insulating layer and the second interlayer insulating layer;

an upper electrode surrounding the lower electrode; and a capacitor dielectric layer disposed between the lower electrode and the upper electrode, the capacitor dielectric layer containing deuterium at a fourth concentration lower than the first concentration, wherein the fourth concentration is a concentration of deuterium atoms contained in the unit volume.

5. The semiconductor device of claim 4, wherein the fourth concentration is lower than the second concentration.

6. The semiconductor device of claim 4, wherein the fourth concentration is greater than the third concentration.

7. The semiconductor device of claim 1, wherein a vertical level of a top surface of the gate electrode is lower than a vertical level of a top surface of the active pattern, wherein at least a portion of the gate electrode overlaps the active pattern in the first horizontal direction.

8. The semiconductor device of claim 1, further comprising:

a source/drain region disposed on at least one side of the gate electrode in the first horizontal direction on the active pattern; and a contact extending through the first interlayer insulating layer in a vertical direction, the contact electrically connecting the source/drain region and the wiring pattern to each other.

9. The semiconductor device of claim 1, further comprising:

a gate spacer disposed on each of both opposing sidewalls of the gate electrode in the first horizontal direction, the gate spacer extending in the second horizontal direction, the gate spacer being in contact with the gate electrode.

10. The semiconductor device of claim 1, further comprising:

a gate spacer disposed on each of both opposing sidewalls of the gate electrode in the first horizontal direction, the gate spacer extending in the second horizontal direction, wherein the gate insulating layer is disposed between the gate electrode and the gate spacer.

11. The semiconductor device of claim 1, further comprising:

a plurality of nanosheets stacked on the active pattern to be spaced apart from each other in a vertical direction, the plurality of nanosheets being surrounded with the gate electrode.

12. A semiconductor device comprising:

a substrate containing deuterium at a first concentration;

an active pattern disposed on the substrate and extending in a first horizontal direction;

a gate electrode disposed on the active pattern and extending in a second horizontal direction different from the first horizontal direction;

a gate insulating layer disposed between the active pattern and the gate electrode, the gate insulating layer containing deuterium at a second concentration lower than the first concentration;

a first interlayer insulating layer disposed on the gate electrode;

a second interlayer insulating layer disposed on the first interlayer insulating layer; and a wiring pattern disposed inside the second interlayer insulating layer, the wiring pattern containing deuterium at a third concentration, wherein each of the first to third concentrations is a concentration of deuterium atoms contained in the same unit volume.

13. The semiconductor device of claim 12, wherein the third concentration is lower than the first concentration.

14. The semiconductor device of claim 12, wherein the third concentration is lower than the second concentration.

15. The semiconductor device of claim 12, further comprising:

a lower electrode extending in a vertical direction between the first interlayer insulating layer and the second interlayer insulating layer;

an upper electrode surrounding the lower electrode; and a capacitor dielectric layer disposed between the lower electrode and the upper electrode, the capacitor dielectric layer containing deuterium at a fourth concentration lower than the first concentration, wherein the fourth concentration is a concentration of deuterium atoms contained in the unit volume.

16. The semiconductor device of claim 15, wherein the fourth concentration is lower than the second concentration.

17. The semiconductor device of claim 12, further comprising:

a source/drain region disposed on at least one side of the gate electrode in the first horizontal direction on the active pattern; and a contact extending through the first interlayer insulating layer in a vertical direction, the contact electrically connecting the source/drain region and the wiring pattern to each other.

18. The semiconductor device of claim 12, further comprising:

a gate spacer disposed on each of both opposing sidewalls of the gate electrode in the first horizontal direction, the gate spacer extends in the second horizontal direction, the gate spacer being in contact with the gate electrode.

19. The semiconductor device of claim 12, further comprising:

a gate spacer disposed on each of both opposing sidewalls of the gate electrode in the first horizontal direction, the gate spacer extending in the second horizontal direction, wherein the gate insulating layer is disposed between the gate electrode and the gate spacer.

20. A semiconductor device comprising:

a substrate containing deuterium at a first concentration;

an active pattern disposed on the substrate and extending in a first horizontal direction;

a gate electrode extending in a second horizontal direction different from the first horizontal direction, a vertical level of a top surface of the gate electrode is lower than a vertical level of a top surface of the active pattern, at least a portion of the gate electrode overlaps with the active pattern in the first horizontal direction;

a gate insulating layer disposed between the active pattern and the gate electrode, the gate insulating layer containing deuterium at a second concentration lower than the first concentration;

a first interlayer insulating layer disposed on the gate electrode;

a lower electrode disposed on the first interlayer insulating layer and extending in a vertical direction;

an upper electrode surrounding the lower electrode;

a capacitor dielectric layer disposed between the lower electrode and the upper electrode, the capacitor dielectric layer containing deuterium at a third concentration lower than the second concentration;

a second interlayer insulating layer disposed on the upper electrode; and a wiring pattern disposed inside the second interlayer insulating layer, the wiring pattern containing deuterium at a fourth concentration lower than the third concentration, wherein each of the first to fourth concentrations is a concentration of deuterium atoms contained in the same unit volume.

* * * * *